(12) United States Patent
Teng et al.

(10) Patent No.: US 11,851,318 B2
(45) Date of Patent: Dec. 26, 2023

(54) MEMS DEVICE AND METHOD FOR MAKING THE SAME

(71) Applicant: TAIWAN SEMICONDUCTOR MANUFACTURING COMPANY, LTD., Hsinchu (TW)

(72) Inventors: Yi-Chuan Teng, Hsinchu (TW); Ching-Kai Shen, Hsinchu (TW); Jung-Kuo Tu, Hsinchu (TW); Wei-Cheng Shen, Hsinchu (TW); Xin-Hua Huang, Hsinchu (TW); Wei-Chu Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 135 days.

(21) Appl. No.: 17/237,575

(22) Filed: Apr. 22, 2021

(65) Prior Publication Data

US 2022/0340407 A1    Oct. 27, 2022

(51) Int. Cl.
*B81B 3/00* (2006.01)
*B81C 1/00* (2006.01)

(52) U.S. Cl.
CPC ............ *B81B 3/0005* (2013.01); *B81B 3/001* (2013.01); *B81C 1/00968* (2013.01); *B81B 2203/0127* (2013.01); *B81B 2203/0315* (2013.01); *B81B 2203/0392* (2013.01); *B81B 2203/04* (2013.01); *B81C 2201/112* (2013.01); *B81C 2203/036* (2013.01)

(58) Field of Classification Search
CPC .... B81B 2203/0315; B81B 2203/0392; B81B 2203/04; B81B 2201/0264; B81B 2201/0271; B81B 7/0025; B81B 3/0005; B81B 3/001; B81B 2203/0127; B81C 2201/112; B81C 2203/036; B81C 1/00968

See application file for complete search history.

(56) References Cited

U.S. PATENT DOCUMENTS

| | | | |
|---|---|---|---|
| 2005/0095833 A1* | 5/2005 | Lutz | B82Y 30/00 438/597 |
| 2007/0275495 A1* | 11/2007 | Mayer | B81C 1/00238 438/197 |
| 2013/0127036 A1* | 5/2013 | Kuo | B81B 3/001 257/E23.181 |
| 2016/0083247 A1* | 3/2016 | Daneman | B81C 1/00246 438/51 |
| 2020/0177155 A1* | 6/2020 | Park | H03H 3/02 |
| 2021/0002128 A1* | 1/2021 | Cok | H10N 30/88 |

* cited by examiner

*Primary Examiner* — Yasser A Abdelaziez
(74) *Attorney, Agent, or Firm* — Birch, Stewart, Kolasch & Birch, LLP

(57) ABSTRACT

A microelectromechanical system device includes a substrate, a dielectric layer, an electrode, a surface modification layer and a membrane. The dielectric layer is formed on the substrate, and is formed with a cavity that is defined by a cavity-defining wall. The electrode is formed in the dielectric layer. The surface modification layer covers the cavity-defining wall, and has a plurality of hydrophobic end groups. The membrane is connected to the dielectric layer, and seals the cavity. The membrane is movable toward or away from the electrode. A method for making a microelectromechanical system device is also provided.

20 Claims, 17 Drawing Sheets

MEMS DEVICE AND METHOD FOR MAKING THE SAME

BACKGROUND

A microelectromechanical system (MEMS) device is a semiconductor device that can be used for converting one form of signal into another. For example, a MEMS device may include a mechanical movable part which allows the MEMS device to detect a mechanical motion and to convert such motion into an electrical signal. The application of MEMS devices, such as in automobile vehicles, mobile devices, medical equipment and many more, has increased dramatically in recent years. With such heavy reliance on MEMS devices, it is increasingly desirable and necessary to improve their reliability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
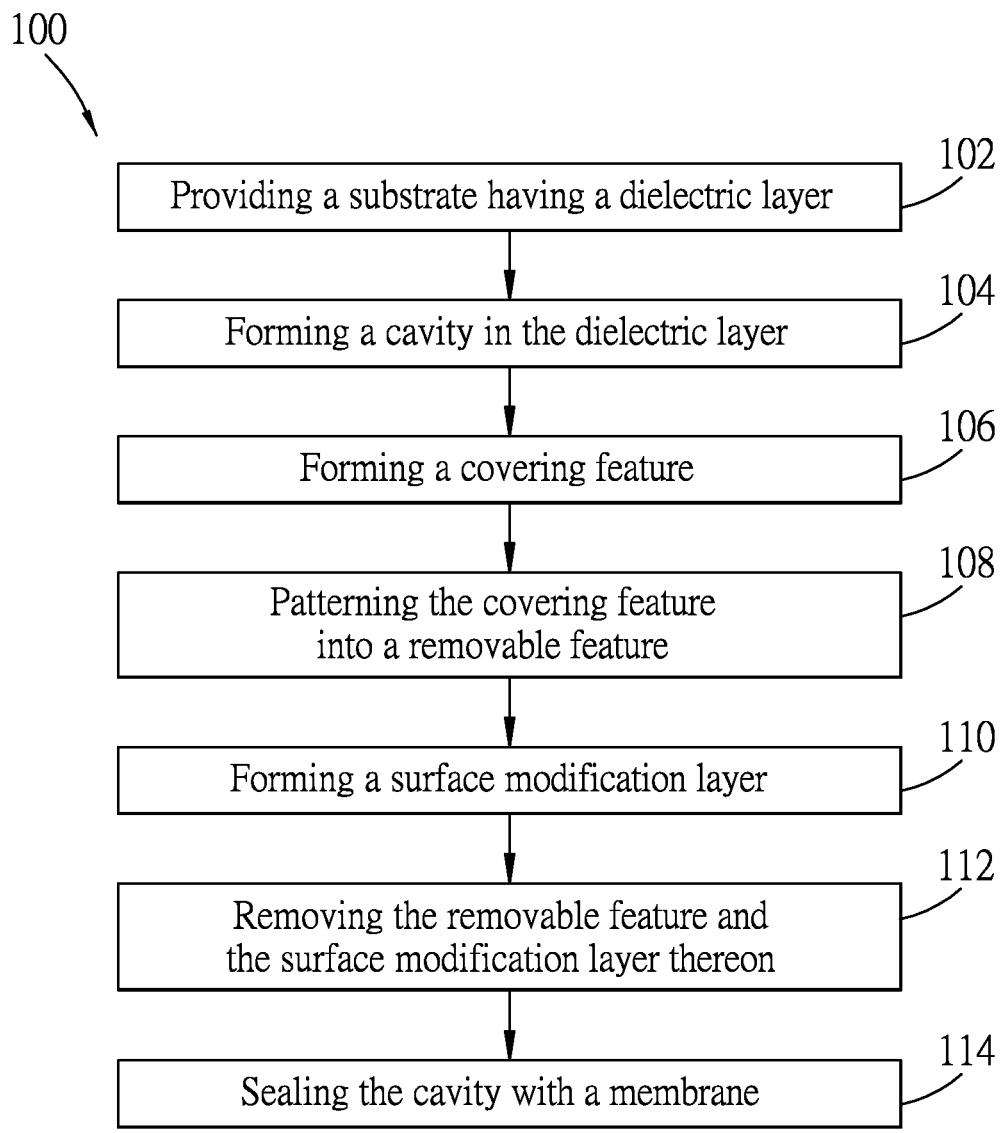
FIG. 1 is a flow chart for making a MEMS device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart 100 showing a method of making a microelectromechanical system (MEMS) device 300 (see FIG. 11) in accordance with some embodiments. FIGS. 2 to 11 show intermediate steps of making the MEMS device 300.

Figure 2:
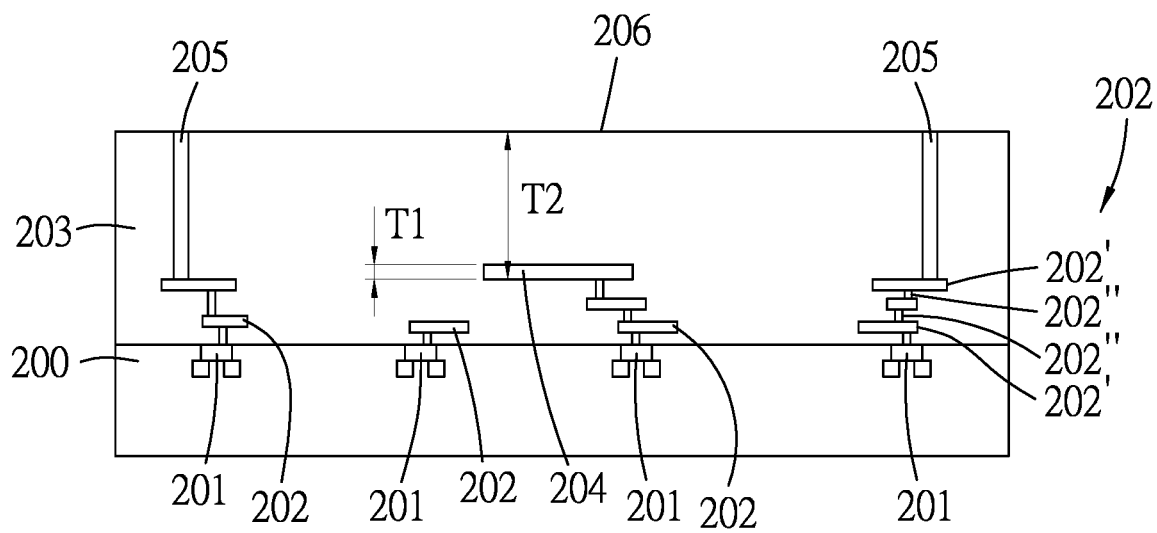
FIGS. 2 to 11 show intermediate steps for making a MEMS device in accordance with some embodiments.

Referring to FIG. 2, a substrate 200 is provided, with a dielectric layer 203 formed thereon. This process is illustrated as process 102 in the flow chart 100 shown in FIG. 1. In accordance with some embodiments, the substrate 200 may be a semiconductor substrate that includes an elementary semiconductor, such as silicon, germanium, the like, or any combination thereof. In some embodiments, the semiconductor substrate may include a compound semiconductor, such as gallium arsenic (GaAs), silicon carbide (SiC), indium arsenide (InAs), indium phosphide (InP), indium antimonide (InSb), gallium phosphide (GaP), the like, or any combination thereof. In some embodiments, the semiconductor substrate may include an alloy semiconductor, such as silicon germanium (SiGe), gallium arsenide phosphide (GaAsP), indium gallium phosphide (GaInP), indium gallium arsenide (GaInAs), aluminium gallium arsenide (AlGaAs), aluminium indium arsenide (AlInAs), gallium indium arsenide phosphide (GaInAsP), the like, or any combination thereof. In some embodiments, the semiconductor substrate may include any combination of an elementary semiconductor, a compound semiconductor and an alloy semiconductor. In some embodiments, the substrate 200 may be a semiconductor on insulator (SOI) substrate (e.g., a silicon germanium on insulator (SGOI) substrate). In some embodiments, the substrate 200 may include a non-semiconductor material, such as glass, quartz (e.g., fused quartz), calcium fluoride ($CaF_2$), the like, or any combination thereof.

In some embodiments, the substrate 200 may include a plurality of active elements, such as transistors 201. Each of the transistors 201 may be a planar transistor or a three dimensional transistor, and may be connected to a corresponding interconnect structure 202 that may be embedded in the dielectric layer 203, such as an inter-metal dielectric (IMD) layer. FIG. 2 schematically shows four of the transistors 201 and four of the interconnect structures 202. However, it should be noted that the numbers, arrangement and ways of connecting the transistors 201 and the interconnect structure 202 may be changed according to practical requirements. Each of the interconnect structures 202 may be made by a suitable technique, such as a back-end-of-line (BEOL) manufacturing process (e.g., a damascene process) or the like, and may include multiple metal layers 202' and vias 202".

In some embodiments, an electrode 204 (may also be referred to as a sensing metal) may be formed to be embedded in the dielectric layer 203, and may be electrically connected to a corresponding interconnect structure 202. In some embodiments, the electrode 204 may be formed by depositing a metal layer (not shown), followed by etching the metal layer into the electrode 204; in other embodiments, the electrode 204 may be made by other suitable techniques. In some embodiments, the electrode 204 may be a top metal layer (i.e., uppermost metal layer) of the corresponding interconnect structure 202. In some embodiments, the electrode 204 may have a thickness (T1) of about 0.6 µm, but other values are also within the scope of this disclosure, and the dimension of the electrode 204 may be changed according to practical requirements. In some embodiments, a distance (T2) between a top surface 206 of the dielectric layer 203 to a bottom surface of the electrode 204 may range from about 0.2 μm to about 2 μm, but other range values are also within the scope of this disclosure.

In some embodiments, two metal contacts 205 may be formed in the dielectric layer 203, and may respectively extend from corresponding two of the interconnect structures 202 to the top surface 206 of the dielectric layer 203. In other embodiments, the metal contacts 205 may be replaced with metal interconnect structures (not shown) which may include multiple metal layers and vias. FIG. 2 schematically shows two of the metal contacts 205. However, it should be noted that the number and arrangement of the metal contacts 205 may be changed according to practical requirements.

Figure 3:
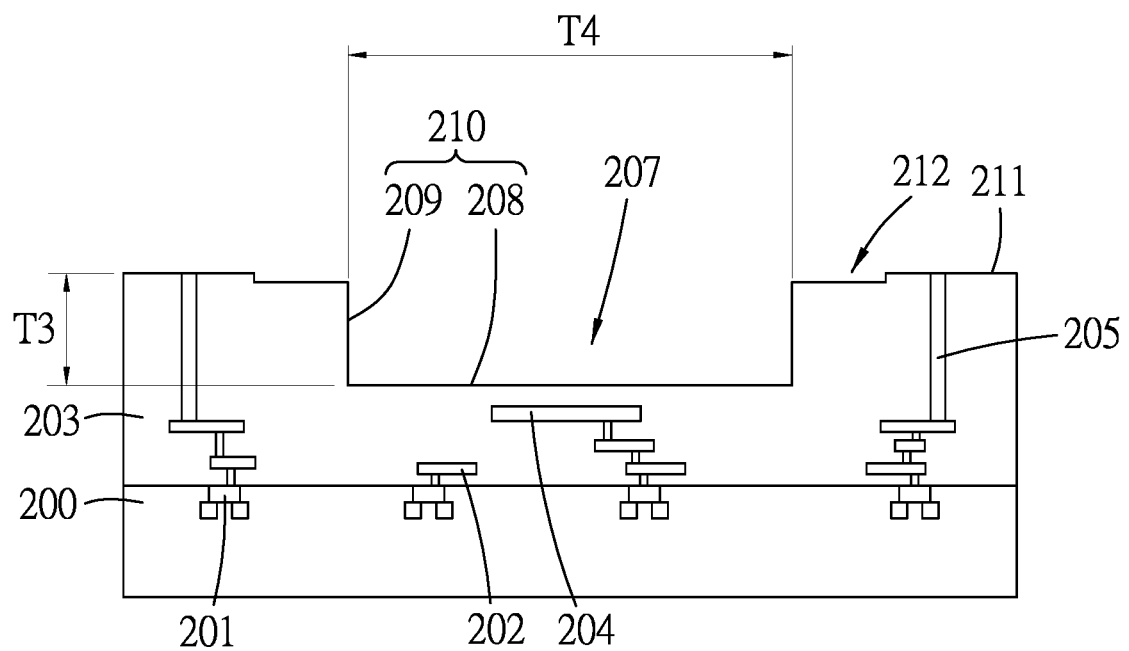

Referring to FIG. 3, after the substrate 200 is provided, the dielectric layer 203 of the substrate 200 is etched. This process is illustrated as process 104 in the flow chart 100 shown in FIG. 1. In some embodiments, the dielectric layer 203 may be etched to form a cavity 207, which may be defined by a cavity-defining wall 210 of the dielectric layer 203 having a bottom wall portion 208 and a sidewall portion 209. In some embodiments, the dielectric layer 203 may be etched by a suitable technique, such as dry etch, wet etch, a combination thereof, or the like. The dry etch may be conducted using a suitable etchant, such as carbon tetrafluoride ($CF_4$), difluoromethane ($CH_2F_2$), fluoroform ($CHF_3$), argon (Ar), helium (He), nitrogen ($N_2$), oxygen ($O_2$), any combination thereof, or the like. The wet etch may be conducted using a suitable etchant, such as hydrofluoric acid (HF) or the like. In some embodiments, the cavity 207 may have a depth (T3), which is measured from the top surface 206 of the dielectric layer 203 (see FIG. 2) to the bottom wall portion 208 of the cavity-defining wall 210 and which ranges from about 0.15 μm to about 1.8 μm, but other range values are also within the scope of this disclosure. In some embodiments, the cavity 207 may have a width (T4) ranging from about 200 μm to about 500 μm, but other range values are also within the scope of this disclosure. In some embodiments, the sidewall portion 209 of the cavity-defining wall 210 may be perpendicular to the bottom wall portion 208 of the cavity-defining wall 210 or may be slanted, which may be the result of deliberate control of the etching process, the properties of the dielectric layer 203 and the etchant used, a combination thereof, or other factors.

FIG. 3 also illustrates that, in some embodiments, a recess 212 may be formed during the step of etching the dielectric layer 203 (i.e., during process 104 in the flow chart 100 shown in FIG. 1), and may be in spatial communication with the cavity 207. In some embodiments, the recess 212 may be formed by performing lateral etch of the dielectric layer 230 during the formation of the cavity 207, which may be achieved by suitable tuning process, such as utilizing loading effect which results in a higher lateral rate. In other embodiments, the recess 212 may be formed after the formation of the cavity 207 by using a suitable technique, such as dry etch, wet etch, a combination thereof or the like. The recess 212 may be used for venting the cavity 207 in a subsequent process, which will be described in detail hereinafter. In some embodiments, referring to FIGS. 2 and 3, a portion of the top surface 206 of the dielectric layer 203 outside of the cavity 207 and the recess 212 may be a bonding wall 211, which may be bonded to a subsequently formed membrane 214 (see FIG. 8). Details of the formation and bonding of the membrane 214 will be described hereinafter. In some embodiments, the electrode 204 may be exposed from the cavity 207.

Figure 4:
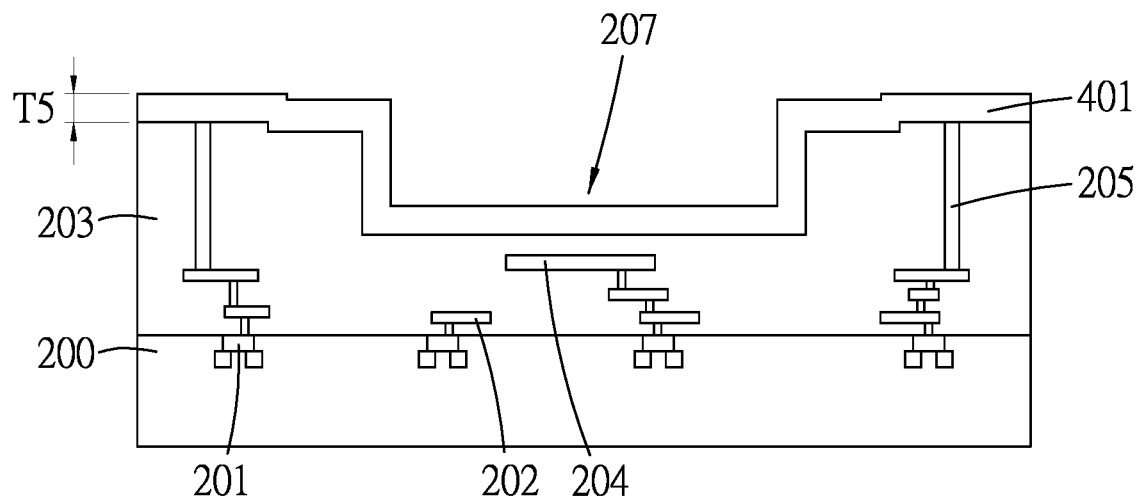

Referring to FIG. 4 with reference to FIG. 3, after the process 104 as illustrated in FIG. 3, a covering feature 401 is formed over the dielectric layer 203. This process is illustrated as process 106 in the flow chart 100 shown in FIG. 1. In some embodiments, the covering feature 401 covers the bonding wall 211, the recess 212 and the cavity-defining wall 210, including the bottom wall portion 208 and the sidewall portion 209. In some embodiments, the covering feature 401 may have a thickness (T5) ranging from about 3 μm to about 7 but other range values are also within the scope of this disclosure. In some embodiments, the covering feature 401 may be a photoresist made of a suitable photosensitive material and formed by a suitable technique, such as spin-coating or the like. The material used for forming the covering feature 401 and the thickness of the covering feature 401 may be determined according to various factors, such as the dimensions of the cavity 207, the recess 212 (see FIG. 3) and the bonding wall 211 (see FIG. 3), and the type of radiation used for exposing the photoresist.

Figure 5:
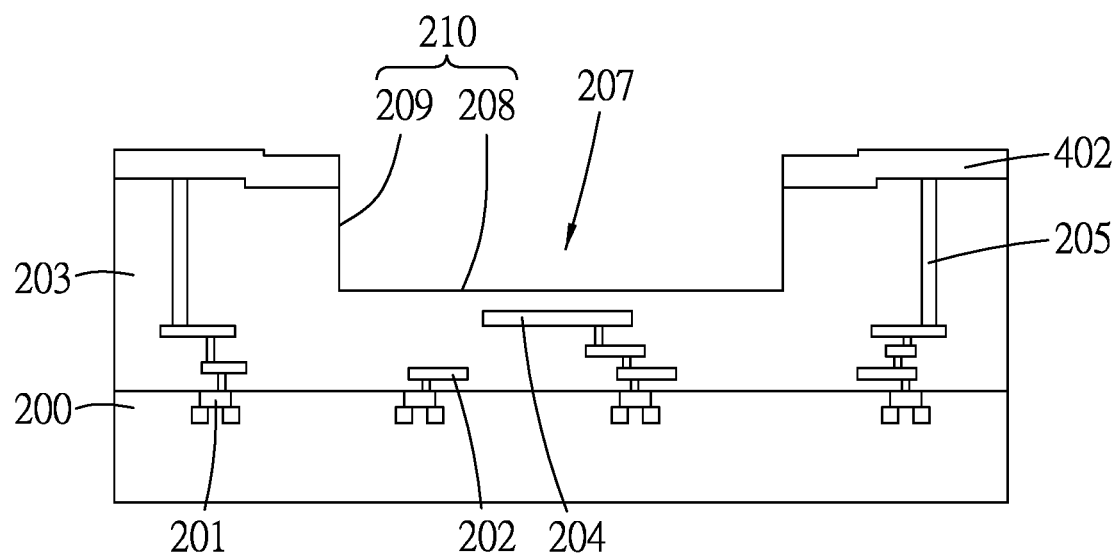

Referring to FIG. 5, after the formation of the covering feature 401 shown in FIG. 4, the covering feature 401 is patterned into a removable feature 402. This process is illustrated as process 108 in the flow chart 100 shown in FIG. 1. In some embodiments, a portion of the covering feature 401 is removed to expose the cavity-defining wall 210, including the bottom wall portion 208 and the sidewall portion 209, and the remaining portion of the covering feature 401 is referred to as the removable feature 402. In some embodiments, the removable feature 402 covers the bonding wall 211 and the recess 212 (see FIG. 3). In some embodiments, the covering feature 401 is patterned by exposing to radiation, followed by developing the exposed portion of the covering feature 401.

Figure 6:
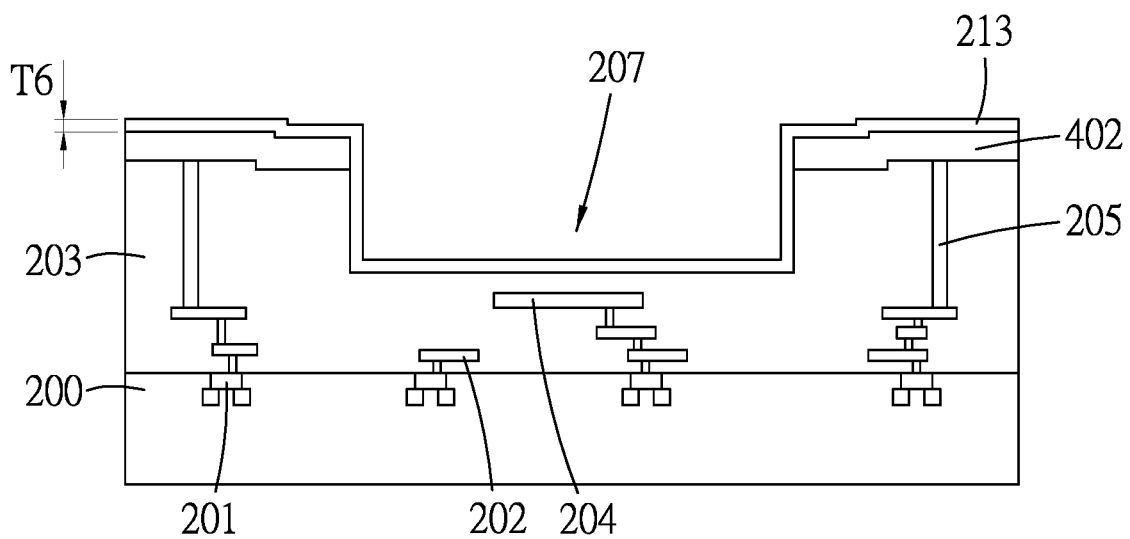

Referring to FIG. 6 with reference to FIG. 5, after the covering feature 401 (see FIG. 4) is patterned into the removable feature 402 in process 108, a surface modification layer 213 is formed. This process is illustrated as process 110 in the flow chart 100 shown in FIG. 1. In some embodiments, the surface modification layer 213 covers the removable feature 402 and the cavity-defining wall 210, including the bottom wall portion 208 and the sidewall portion 209. In some embodiments, the surface modification layer 213 may be formed by exposing the removable feature 402 and the cavity-defining wall 210 to a self-assembled precursor, such as a silane-based material, an alkyl-based material, other suitable materials, or any combination thereof. In some embodiments, the self-assembled precursor may be in gaseous form or in aqueous form, based on practical requirements. The self-assembled precursor has a plurality of self-assembled molecules each having a head group that can be bonded to the removable feature 402 or the cavity-defining wall 210 of the dielectric layer 203, and a hydrophobic end group (e.g., a long-chain alkyl group or the like) that is connected to the head group, thereby forming a self-assembled monolayer (SAM) (i.e., the surface modification layer 213) on the removable feature 402 and the cavity-defining wall 210 of the dielectric layer 203. Examples of the self-assembled precursor may include octadecyltrichlorosilane (OTS), dodecyltrichlorosilane (DTS), perfluorodecyltrichlorosilane (FDTS), hexadecyltrichlorosilane (HTS), dimethyldichlorosilane (DDMS), fluoro-octyl-trichloro-silane (FOTS), but other suitable materials may also be used. In some embodiments, the surface modification layer 213 may be made of other hydrophobic materials, such as polytetrafluoroethylene (PTFE, also known as Teflon), amorphous carbon (α-carbon), a high-dielectric (high-k) material (e.g., tantalum oxide ($Ta_2O_5$), hafnium oxide ($HfO_2$), aluminum oxide ($Al_2O_3$), zirconium oxide ($ZrO_2$), or the like), any combination thereof, or the like. In some embodiments, the surface modification layer 213 may have a thickness (T6) ranging from about 10 Å to about 100 Å.

Figure 7:
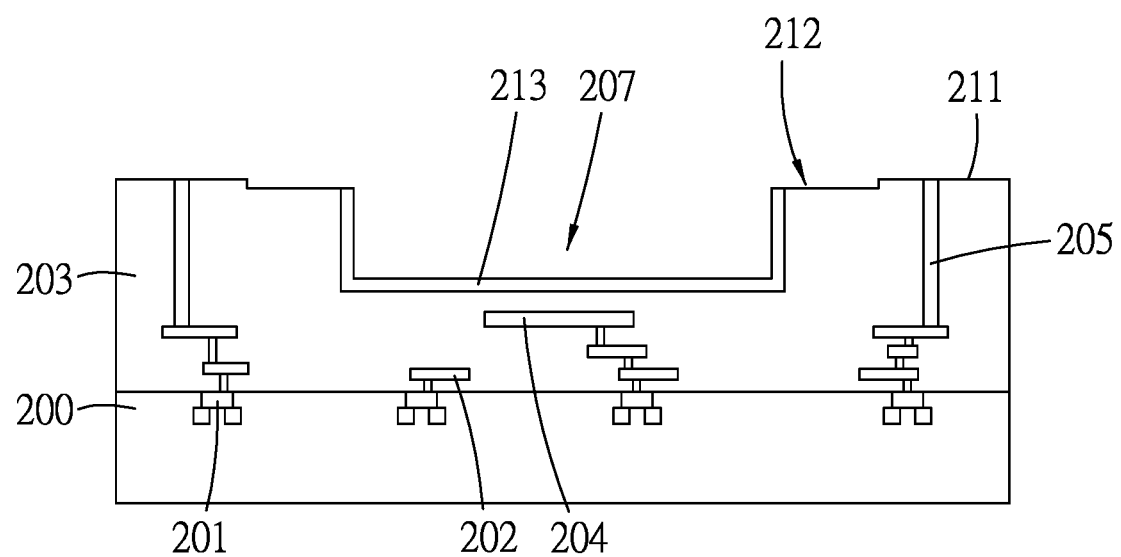

Referring to FIG. 7, after the formation of the surface modification layer 213 as shown in FIG. 6, the removable feature 402 and the surface modification layer 213 on the removable feature 402 are removed to expose the recess 212 and the bonding wall 211, and a portion of the surface modification layer 213 remains on the cavity-defining wall 210, including the bottom wall portion 208 and the sidewall portion 209 (see FIG. 5). This process is illustrated as process 112 in the flow chart 100 shown in FIG. 1. The removable feature 402 may be removed by a suitable technique, such as a wet chemical etching, a low-pressure plasma etching, a combination thereof, or the like Referring to FIG. 8, after the removal of the removable feature 402 and the surface modification layer 213 on the removable feature 402 as shown in FIG. 7, a semiconductor wafer (not shown) is connected to the bonding wall 211 of the dielectric layer 203 (see FIG. 7), followed by thinning the semiconductor wafer to form a membrane 214. In some embodiments, the semiconductor wafer may be a pure semiconductor wafer, a doped semiconductor wafer, an SOI wafer or the like, and may be formed with electrode and/or interconnect therein. In some embodiments, the semiconductor wafer may be connected to the bonding wall 211 by a suitable technique, such as fusion bonding or the like. In some embodiments, fusion bonding involves bringing the semiconductor wafer in physical contact with the bonding wall 211, such that the semiconductor wafer may be held on the bonding wall 211 through an atomic attraction force, such as Van der Waals force. Afterward, an annealing process is carried out to bond the semiconductor wafer to the bonding wall 211 through the formation of Si—Si bonding or the like. The semiconductor wafer may also be bonded to the bonding wall 211 by other techniques, such as eutectic bonding or the like. After the semiconductor wafer is bonded to the bonding wall 211, the thickness of the semiconductor wafer is thinned down to a desirable value by, for example, mechanically polishing the semiconductor wafer, followed by a chemical mechanical planarization (CMP), to form the membrane 214 with desirable thickness. In some embodiments, the membrane 214 is electrically connected to the transistors 201 through the metal contacts 205 and the interconnect structures 202. In some embodiments, the membrane 214 may have a thickness (T7) of about 5 μm, but other values are also within the scope of this disclosure.

Figure 8:
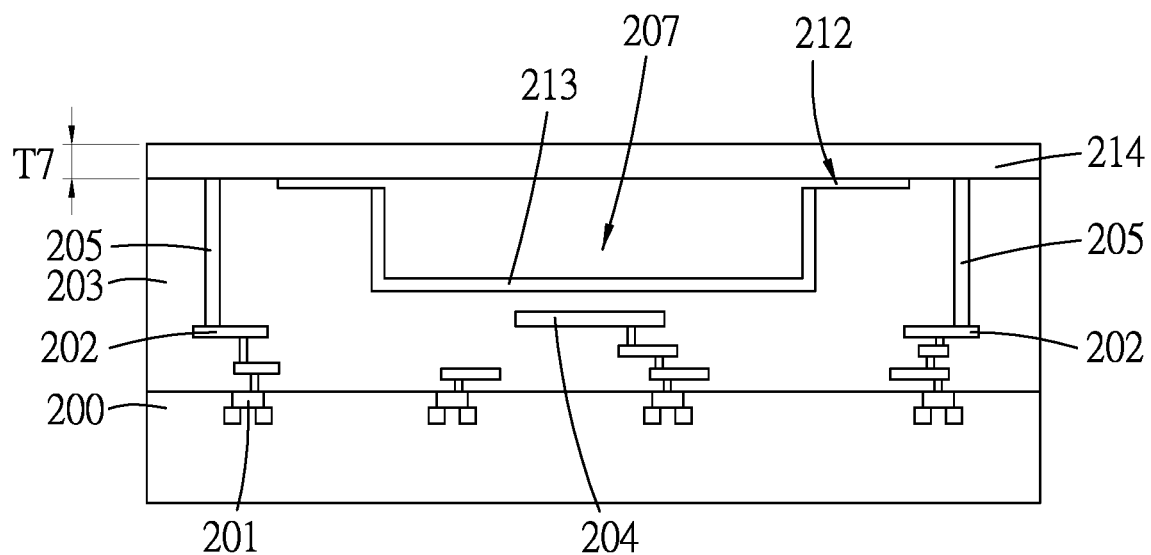
Figure 9:
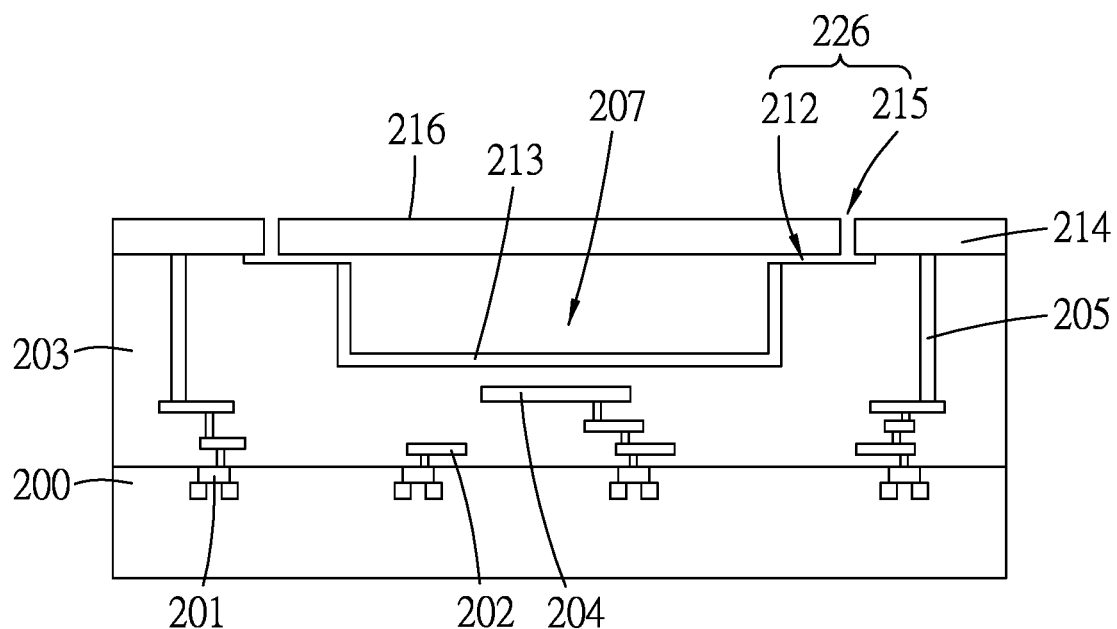

Referring to FIG. 9, after the formation of the membrane 214 as illustrated in FIG. 8, an opening 215 is formed to penetrate the membrane 214. The opening 215 may be in spatial communication with the recess 212, and may cooperate with the recess 212 to define a venting passage 226. There are two openings schematically shown in FIG. 9, and only one is labeled as 215 and described hereinafter for the sake of brevity. It should be noted that the number and location of the opening 215 may be changed according to practical requirements. In some embodiments, the opening 215 may be formed by etching the membrane 214 using a suitable technique, such as dry etch, wet etch, a combination thereof, or the like. After the formation of the opening 215, the cavity 207 can be vented through the venting passage 226 (i.e., the recess 212 and the openings 215 combined). In some embodiments, the cavity 207 may be pumped down to vacuum.

Figure 10:
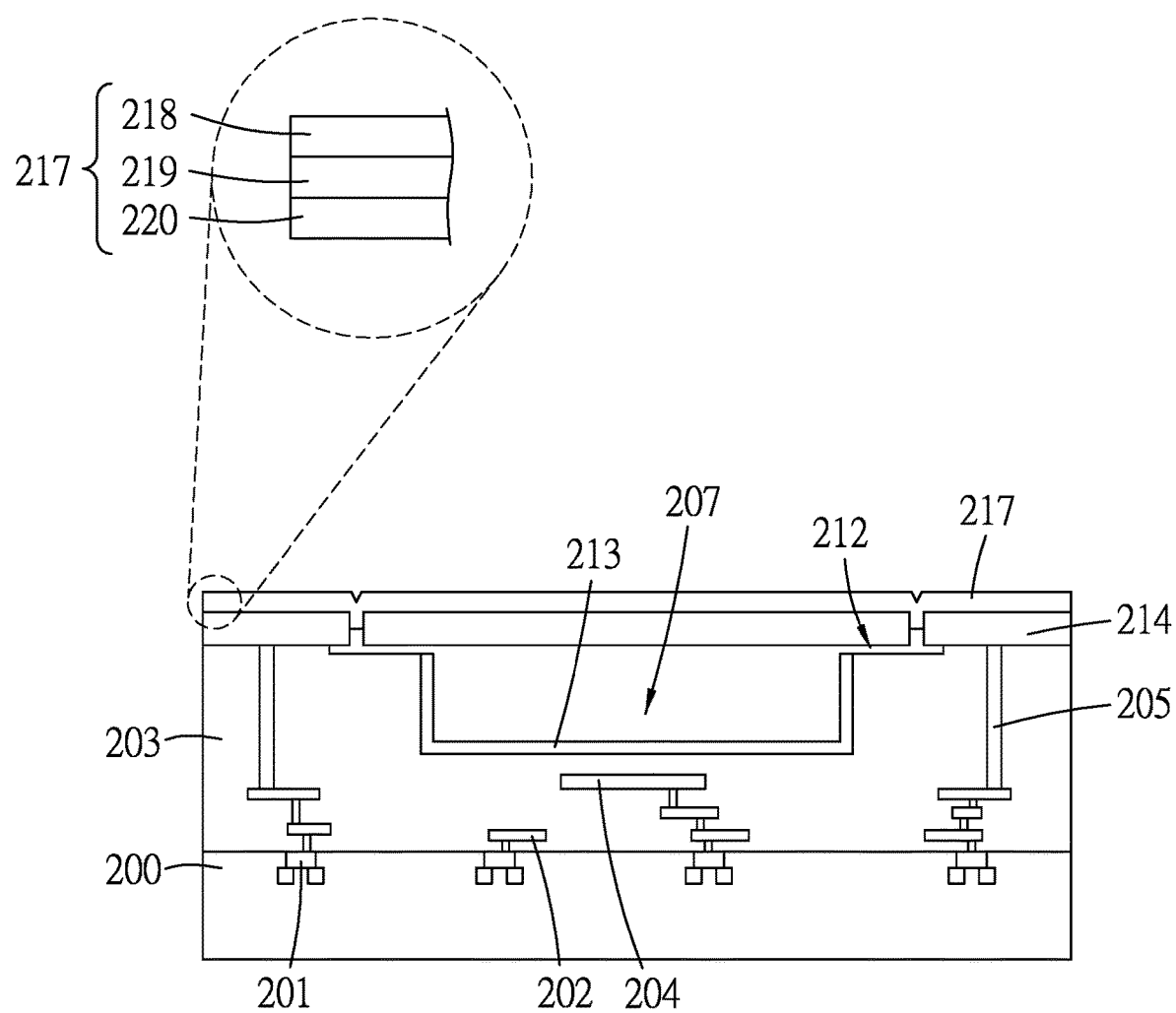

Referring to FIG. 10, after the process illustrated in FIG. 9, a seal layer 217 may be deposited on a top surface 216 of the membrane 214 (see FIG. 9), and a portion of the seal layer 217 may extend into the opening 215 (see FIG. 9). In some embodiments, the seal layer 217 may be a single layer of metal for sealing the opening 215; in other embodiments, the seal layer 217 may have a multi-layered structure, which may include a first sub-layer 218 made of titanium nitride (TiN), a second sub-layer 219 made of aluminum-copper (Al—Cu) alloy, and a third sub-layer 220 made of titanium nitride (TiN). The first and third sub-layers 218, 220 may prevent oxidation of the second sub-layer 219, and may improve adhesion of the second sub-layer 219 to the membrane 214. It should be noted that the number of sub-layers of the seal layer 217 may be changed, and the sub-layers of the seal layer 217 may be made of other suitable materials according to practical requirements.

Figure 11:
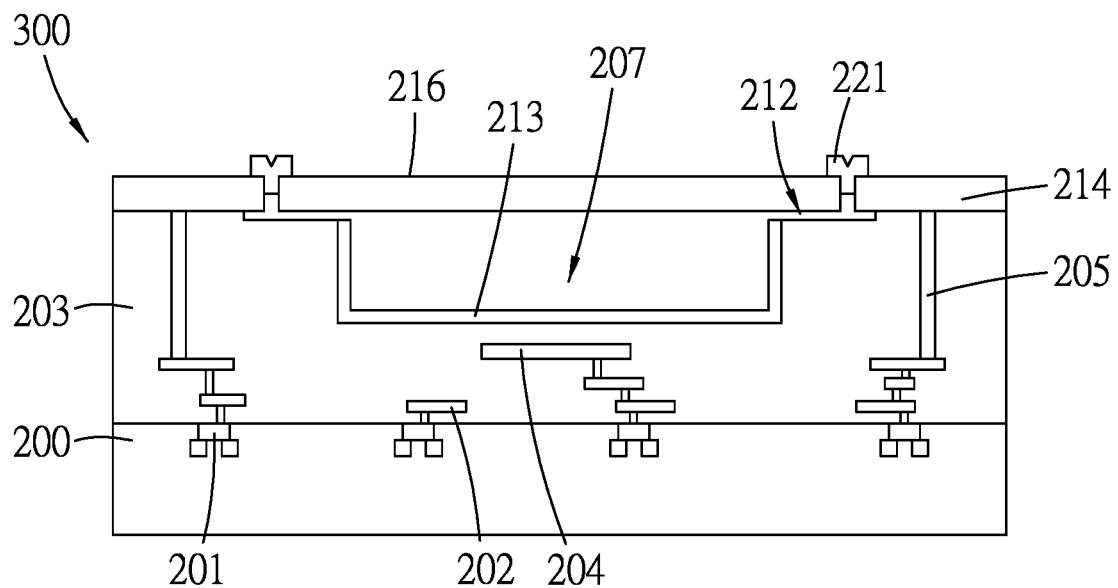

Referring to FIG. 11, after the formation of the seal layer 217 shown in FIG. 10, the seal layer 217 may be etched by a suitable technique, such as dry etch or the like to form a seal 221 sealing the opening 215 (see FIG. 9) such that the cavity 207 and the venting passage 226 may be hermetically isolated from the outside environment. The MEMS device 300 is therefore obtained. The processes shown in FIGS. 8 to 11 may be collectively referred to as process 114 in the flow chart 100 shown in FIG. 1. In some embodiments, the MEMS device 300 includes the surface modification layer 213 that may be a substantial conformal layer formed on the bottom wall portion 208 and the sidewall portion 209 of the cavity-defining wall 210 of the dielectric layer 203 (see FIG. 5).

In some embodiments, the membrane 214 is movable toward or away from the electrode 204. For example, when the MEMS device 300 is exposed to an external acoustic wave hitting the top surface 216 of the membrane 214, a center portion of the membrane 214 would be bent toward the electrode 204. By measuring the change in capacitance between the electrode 204 and the membrane 214, the intensity of the acoustic wave can be measured. In some embodiments, an alternating current (AC) voltage may be applied to the membrane 214 to induce vibration of the membrane 214, such that the MEMS device 300 may serve as a transmitter. It should be noted that the MEMS device 300 has various applications other than acoustic sensing or transmitting. The membrane 214 of the MEMS device 300 may serve as a moving part used in various devices, such as a capacitive micromachined ultrasonic transducer (CMUT), a pressure sensor, an actuator, and other suitable devices.

Without the surface modification layer 213, the membrane 214 may stick to the dielectric layer 203 when contacting the dielectric layer 203, due to the formation of Si—Si or Si-oxygen bond or electrostatic charge between the membrane 214 and the bottom wall portion 208 or the sidewall portion 209 of the cavity-defining wall 210 of the dielectric layer 203 (see FIG. 3). The membrane 214 being temporarily or permanently stick to the dielectric layer 203 may cause the MEMS device 300 to malfunction or to be permanently damaged. Therefore, the surface modification layer 213 (may also be referred to as an anti-stiction coating) may prevent such issue from happening. When the thickness (T6) of the surface modification layer 213 (see FIG. 6) is less than about 10 Å, the anti-stiction property of the surface modification layer 213 may not be satisfactory; when the thickness (T6) of the surface modification layer 213 is greater than about 100 Å, the overall dielectric constant of the MEMS device 300 may be undesirably high, which may adversely affect operation of the MEMS device 300.

In some embodiments, a top view of the membrane 214 and/or the cavity 207 of the MEMS device 300 can be in any desirable shape, such as circular, oval, ellipse or the like, based on practical requirements. In some embodiments, the dielectric layer 203 may be formed with a plurality of the cavities 207 (only one is shown for the sake of brevity) that are separated from each other, and the membrane 214 covers and seals all of the cavities 207.

Figure 12:
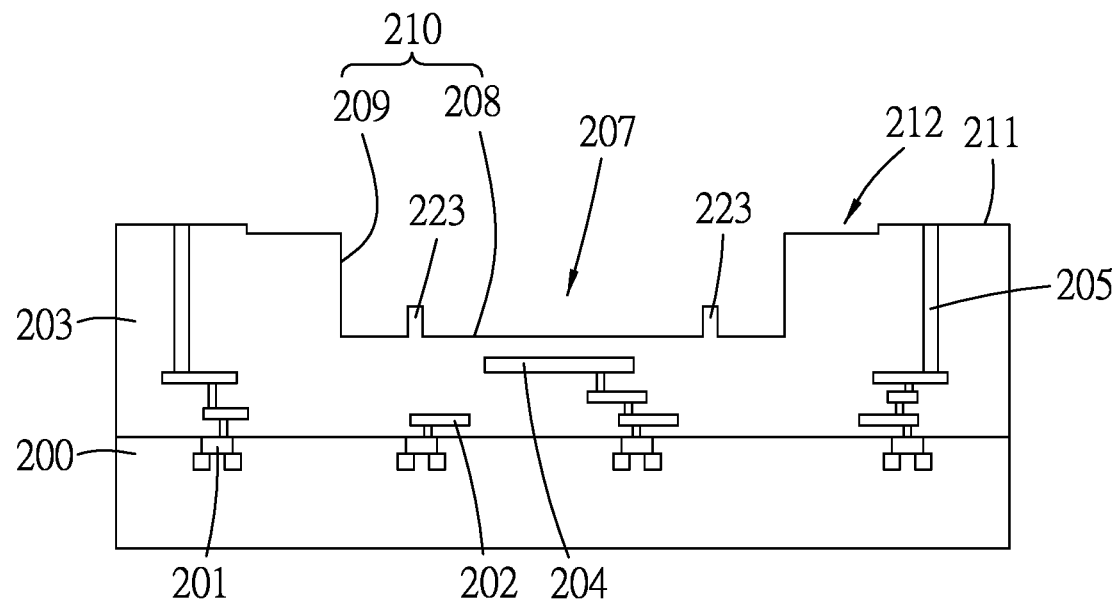
FIGS. 12 to 16 show intermediate steps for making a MEMS device in accordance with some embodiments.

Referring to FIG. 12, in some embodiments, during the formation of the cavity 207 (i.e., the process 104 in the flow chart 100 shown in FIG. 1), a plurality of protruding bumps 223 may be formed in the cavity 207 on the bottom wall portion 208 of the cavity-defining wall 210. It should be noted that the number of the protruding bump(s) 223 may be one or greater than two, according to practical requirements. The dimension, arrangement and shape of the protruding bumps 223 may also be changed according to practical requirements. In some embodiments, the protruding bumps 223 may be formed during the formation of the cavity 207 by controlling the etching profile of the dielectric layer 203. In some embodiments, the protruding bumps 223 may be formed by further etching the dielectric layer 203 after the formation of the cavity 207 as shown in FIG. 3. In some embodiments, after the formation of the cavity 207 as shown in FIG. 3, the bottom wall portion 208 of the cavity-defining wall 210 may be covered with a mask layer (not shown) formed with openings (not shown), followed by epitaxially growing the protruding bumps 223 from the bottom wall portion 208 of the cavity-defining wall 210 of the dielectric layer 203 exposed from the openings of the mask layer, and then removing the mask layer. In some embodiments, the protruding bumps 223 may be made of a suitable material, such as a dielectric material or the like, and may be deposited on the bottom wall portion 208 of the cavity-defining wall 210 after the cavity 207 is formed.

Figure 13:
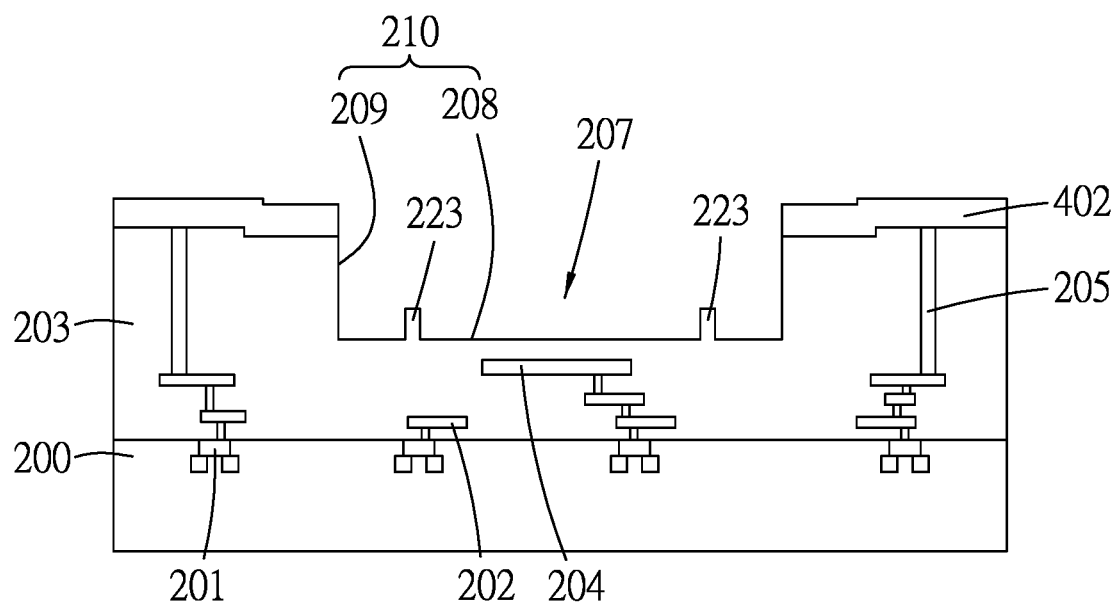

Referring to FIG. 13, after the formation of the cavity 207 and the protruding bumps 223 as illustrated in FIG. 12, processes 106 and 108 in the flow chart 100 shown in FIG. 1 may be carried out to form the removable feature 402 that covers the bonding wall 211 and the recess 212 (see FIG. 12).

Figure 14:
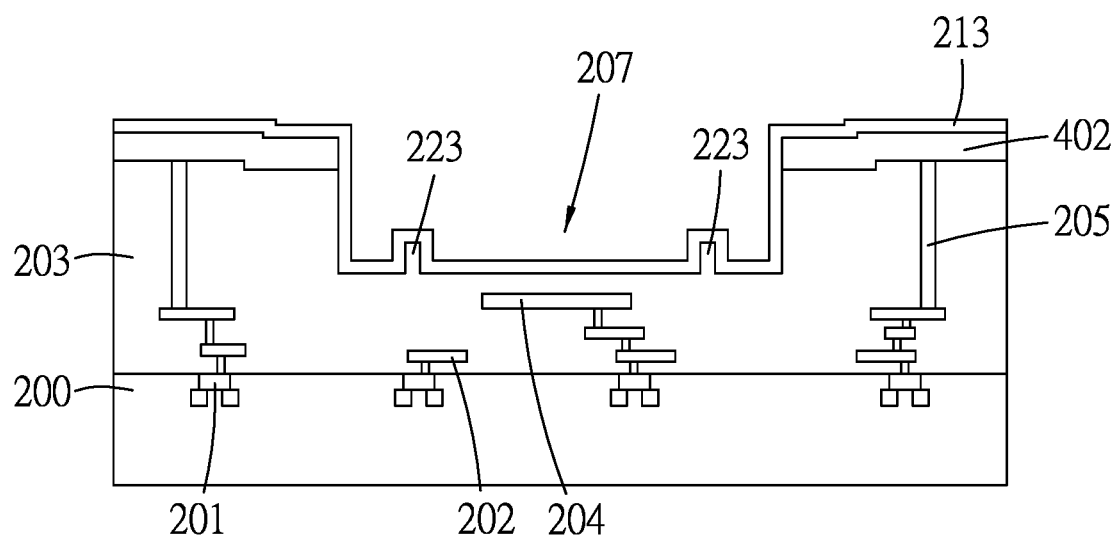

Referring to FIG. 14, after the formation of the removable feature 402 as illustrated in FIG. 13, process 110 in the flow chart 100 shown in FIG. 1 may be carried out to form the surface modification layer 213, which covers the removable feature 402, the bottom wall portion 208 and the sidewall portion 209 of the cavity-defining wall 210 (see FIG. 13), and the protruding bumps 223.

Figure 15:
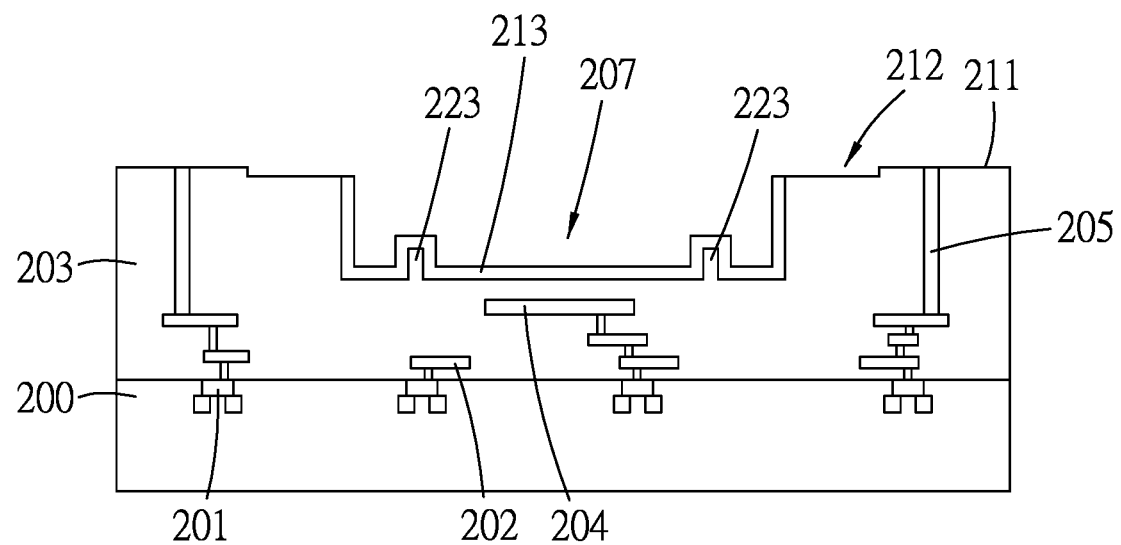

Referring to FIG. 15, after the formation of the surface modification layer 213 as illustrated in FIG. 14, process 112 in the flow chart 100 shown in FIG. 1 may be carried out to remove the removable feature 402 and the surface modification layer 213 on the removable feature 402 (see FIG. 14) so as to expose the recess 212 and the bonding wall 211. The remaining surface modification layer 213 covers the bottom wall portion 208 and the sidewall portion 209 of the cavity-defining wall 210 (see FIG. 13), and the protruding bumps 223.

Figure 16:
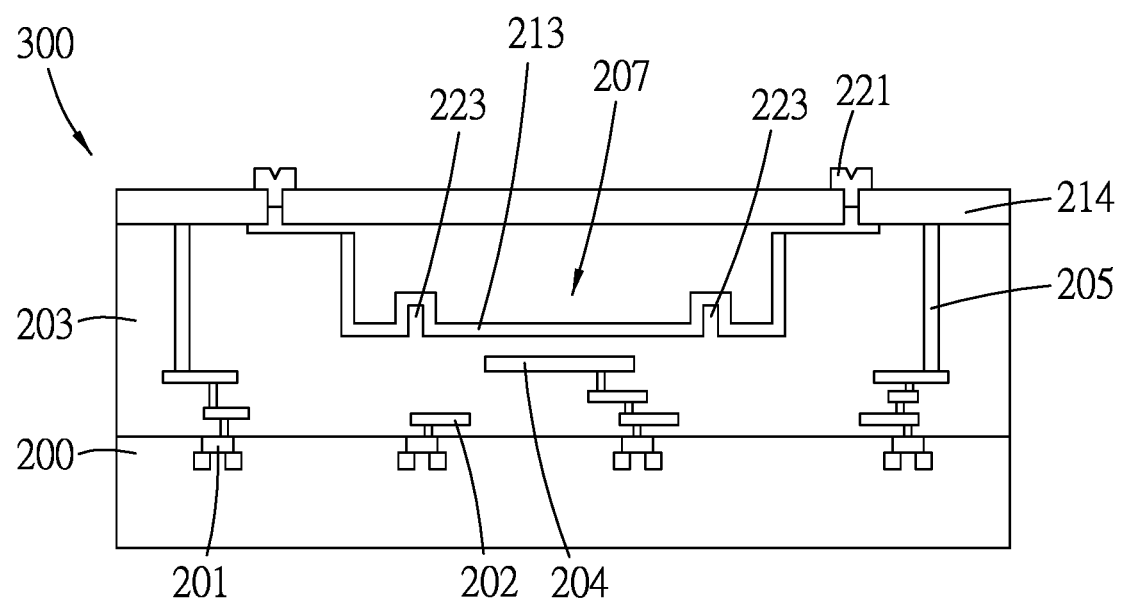

Referring to FIG. 16, after the removal of the removable feature 402 and the surface modification layer 213 on the removable feature 402 as illustrated in FIG. 15, process 114 in the flow chart 100 shown in FIG. 1 may be carried out to obtain the MEMS device 300. In some embodiments, the protruding bumps 223 may also possess anti-stiction function by, for example, decreasing the contact area between the membrane 214 and the bottom wall portion 208 of the cavity-defining wall 210 (see FIG. 13) when the membrane 214 is flexed toward the electrode 204. The surface modification layer 213 covering the protruding bumps 223 may further improve anti-stiction property of the MEMS device 300.

Figure 17:
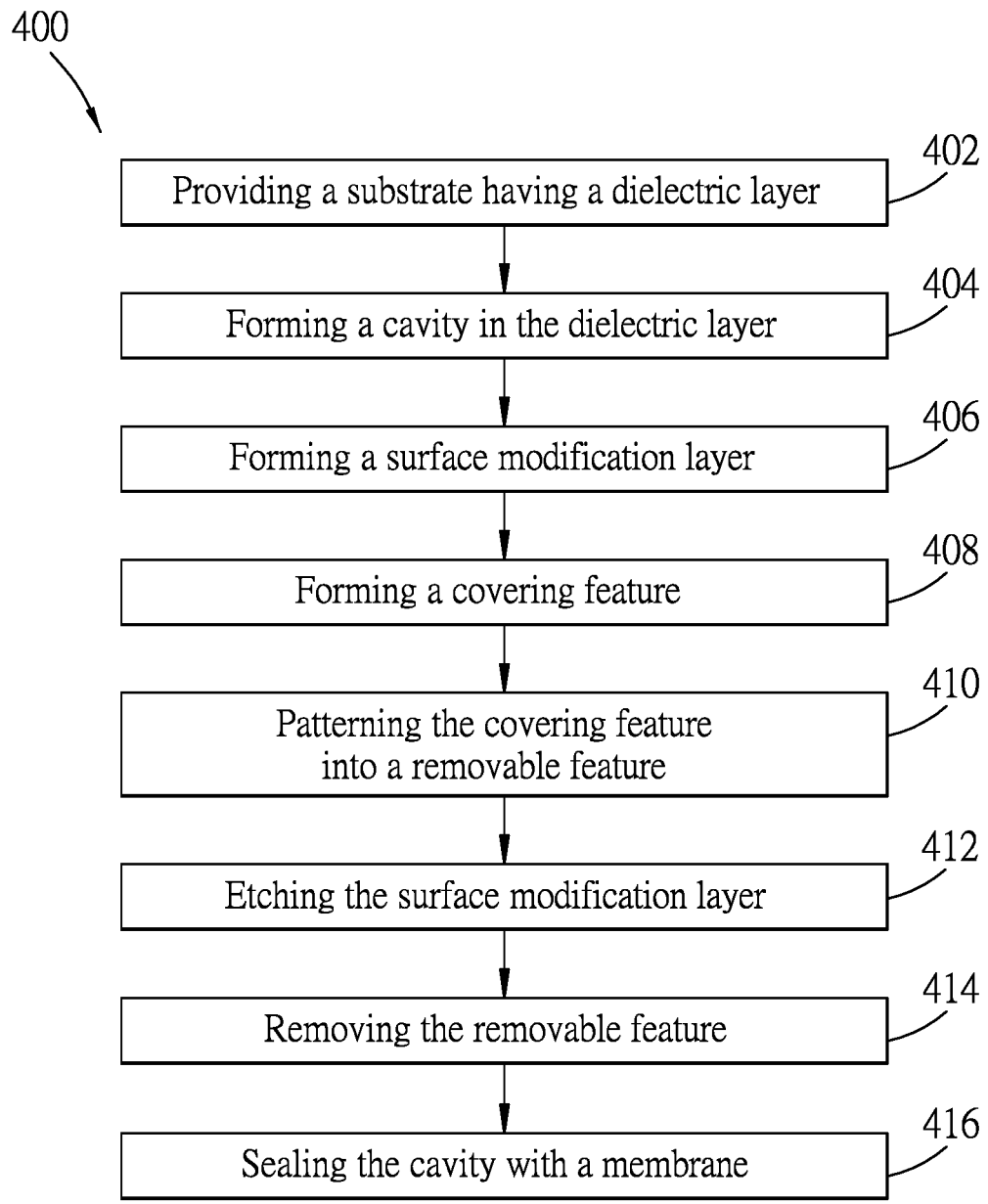
FIG. 17 is a flow chart for making a MEMS device in accordance with some embodiments.

FIG. 17 is a flow chart 400 showing a method of making the MEMS device 300 (see FIG. 11) in accordance with some embodiments.

As shown in FIG. 17, processes 402 and 404 are first carried out. In some embodiments, processes 402 and 404 in the flow chart 400 in FIG. 17 are similar to processes 102 and 104 in the flow chart 100 in FIG. 1, which respectively correspond to FIGS. 2 and 3. Afterward, referring to FIG. 18, the surface modification layer 213 is formed. This process is illustrated as process 406 in the flow chart 400 shown in FIG. 17. In some embodiments, with reference to FIGS. 3 and 18, the surface modification layer 213 may be formed to cover the bonding wall 211, the recess 212, and the bottom wall portion 208 and the sidewall portion 209 of the cavity-defining wall 210.

Figure 19:
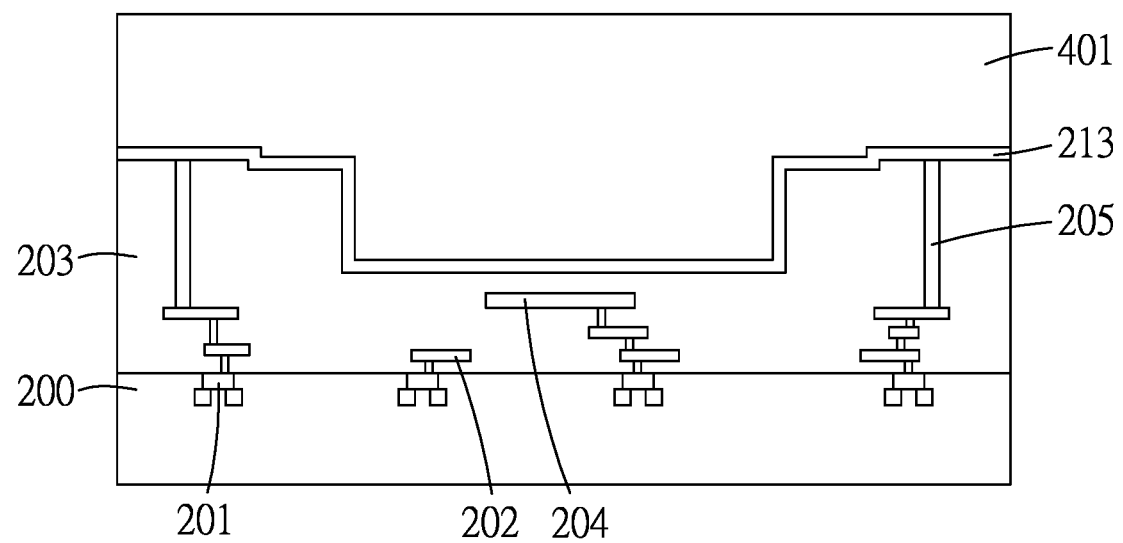

Referring to FIG. 19, after the formation of the surface modification layer 213, the covering feature 401 is formed to cover the surface modification layer 213. This process is illustrated as process 408 in the flow chart 400 shown in FIG. 17.

Figure 20:
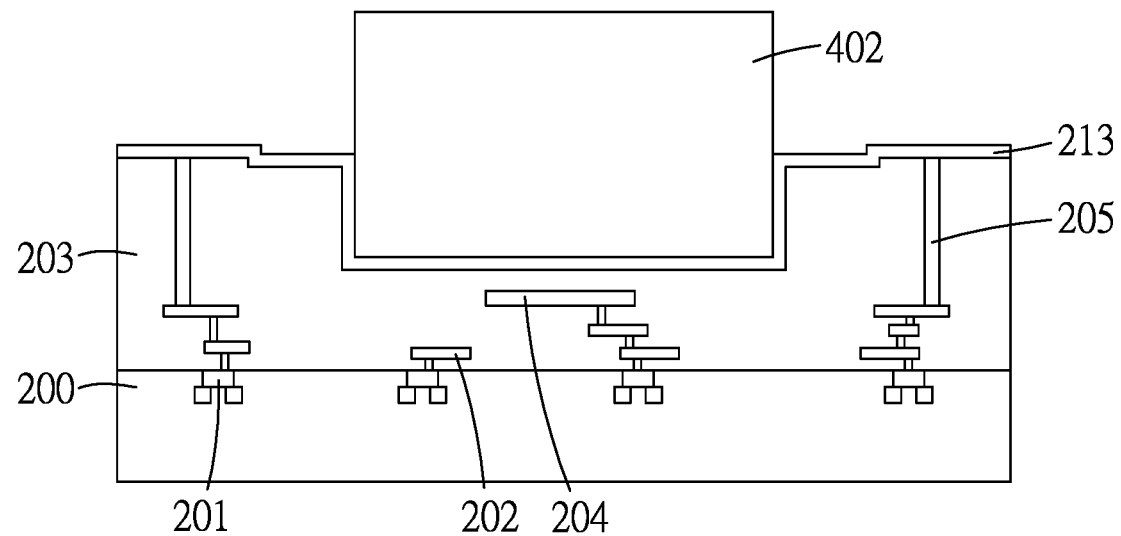

Referring to FIG. 20, after the formation of the covering feature 401, the covering feature 401 may be patterned into the removable feature 402 covering the surface modification layer 213 on the bottom wall portion 208 and the sidewall portion 209 of the cavity-defining wall 210 (see FIG. 3) and exposing the surface modification layer 213 outside of the removable feature 402 (i.e., exposing the surface modification layer 213 covering the bonding wall 211 and the recess 212 (see FIG. 3)). This process is illustrated as process 410 in the flow chart 400 shown in FIG. 17.

Figure 21:
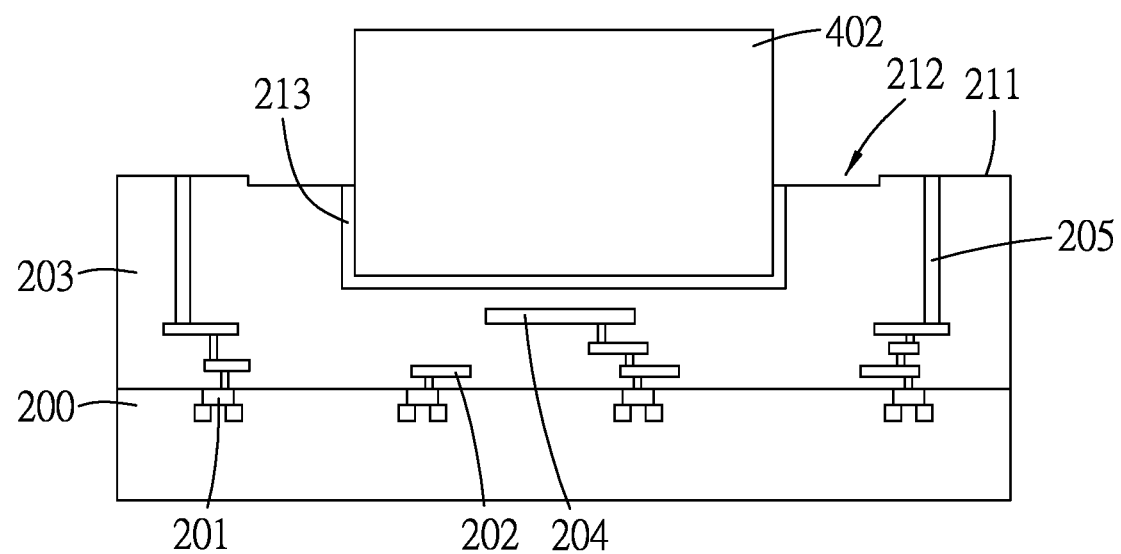

Referring to FIG. 21, after the formation of the removable feature 402, the surface modification layer 213 outside of the removable feature 402 may be removed by a suitable technique, such as dry etch, wet etch, a combination thereof, or the like, thereby exposing the bonding wall 211 and the recess 212 from the surface modification layer 213. This process is illustrated as process 412 in the flow chart 400 shown in FIG. 17. In some embodiments, the removable feature 402 covering the surface modification layer 213 may serve to protect the surface modification layer 213 (i.e., the surface modification layer 213 covering the bottom wall portion 208 and the sidewall portion 209 of the cavity-defining wall 210 (see FIG. 3)). Afterward, process 414 in the flow chart 400 shown in FIG. 17 may be carried out to remove the removable feature 402 so as to expose the surface modification layer 213 previously covered by the removable feature 402, thereby obtaining a structure illustrated in FIG. 7. Then, process 416 in the flow chart 400 shown in FIG. 17, which correspond to process 114 in the flow chart 100 in FIG. 1, may be carried out to obtain the MEMS device 300 shown in FIG. 11.

Figure 18:
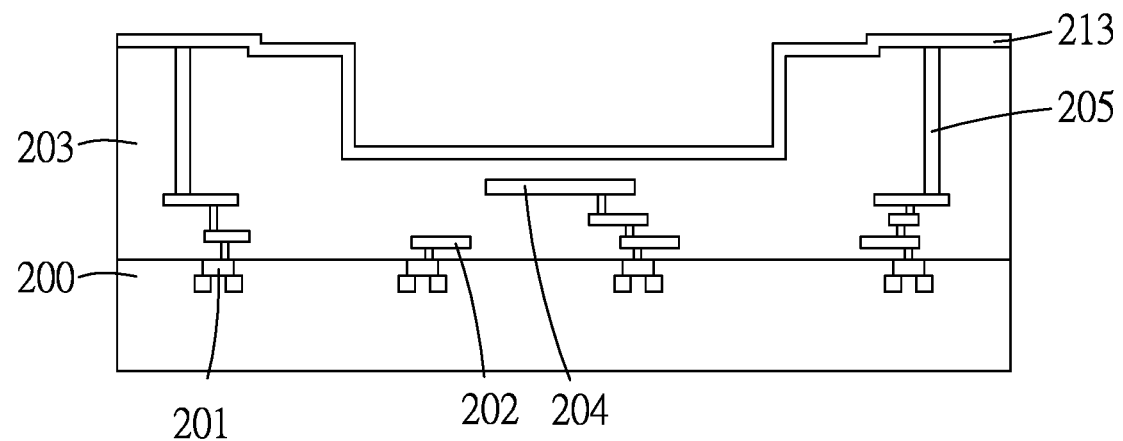
FIGS. 18 to 21 show intermediate steps for making a MEMS device in accordance with some embodiments.
Figure 22:
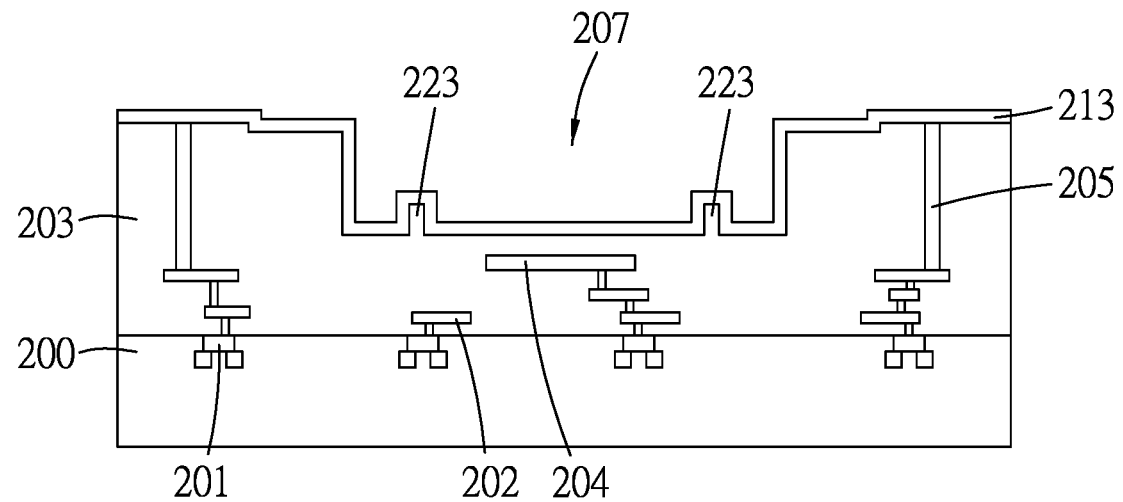
FIGS. 22 to 27 show intermediate steps for making a MEMS device in accordance with some embodiments.

The structure shown in FIG. 22 is a variation of that in FIG. 18. In FIG. 22, the protruding bumps 223 are formed in the cavity 207 on the bottom wall portion 208 of the cavity-defining wall 210 of the dielectric layer 203 (see FIG. 12), and the surface modification layer 213 covers the bonding wall 211, the recess 212, the bottom wall portion 208 and the sidewall portion 209 of the cavity-defining wall 210, and the protruding bumps 223.

Figure 23:
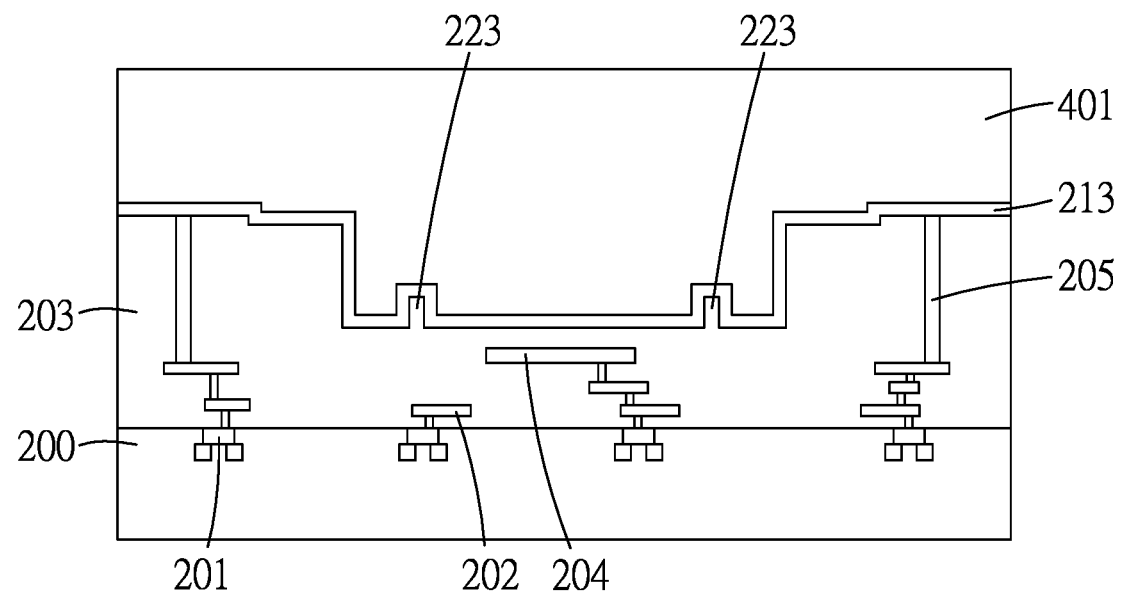

The structure shown in FIG. 23 is a variation of that in FIG. 19. Similar to FIG. 19, as illustrated in FIG. 23, the covering feature 401 is formed to cover the surface modification layer 213, including the portion of the surface modification layer 213 covering the protruding bumps 223.

Figure 24:
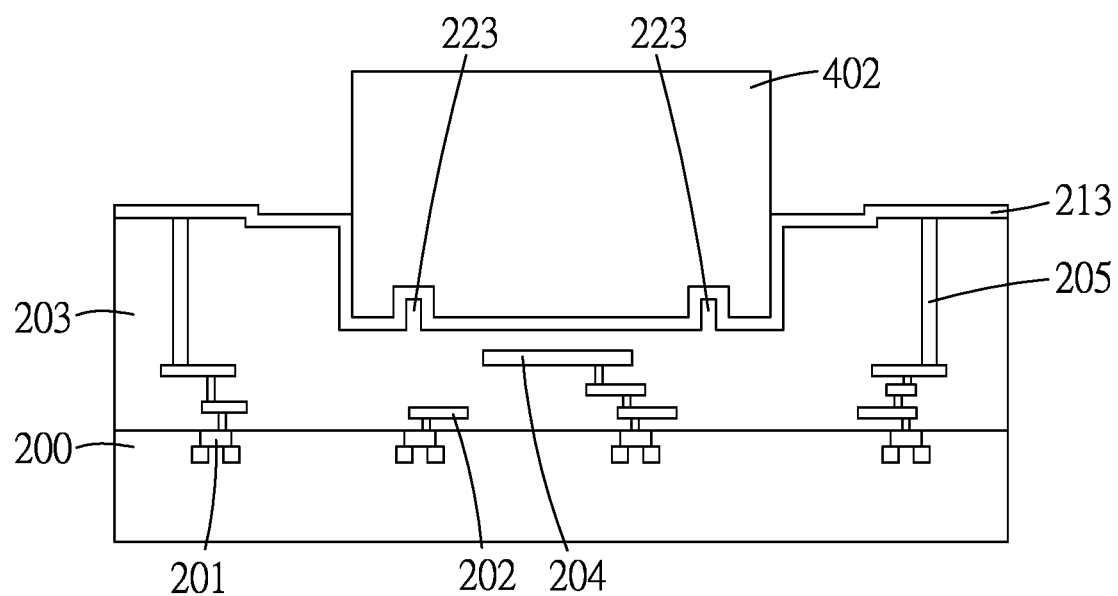

The structure shown in FIG. 24 is a variation of that in FIG. 20. Similar to FIG. 20, as illustrated in FIG. 24, the covering feature 401 may be patterned into the removable feature 402 covering the surface modification layer 213 on the bottom wall portion 208 and the sidewall portion 209 of the cavity-defining wall 210 (see FIG. 12) and covering the surface modification layer 213 which covers the protruding bumps 223.

Figure 25:
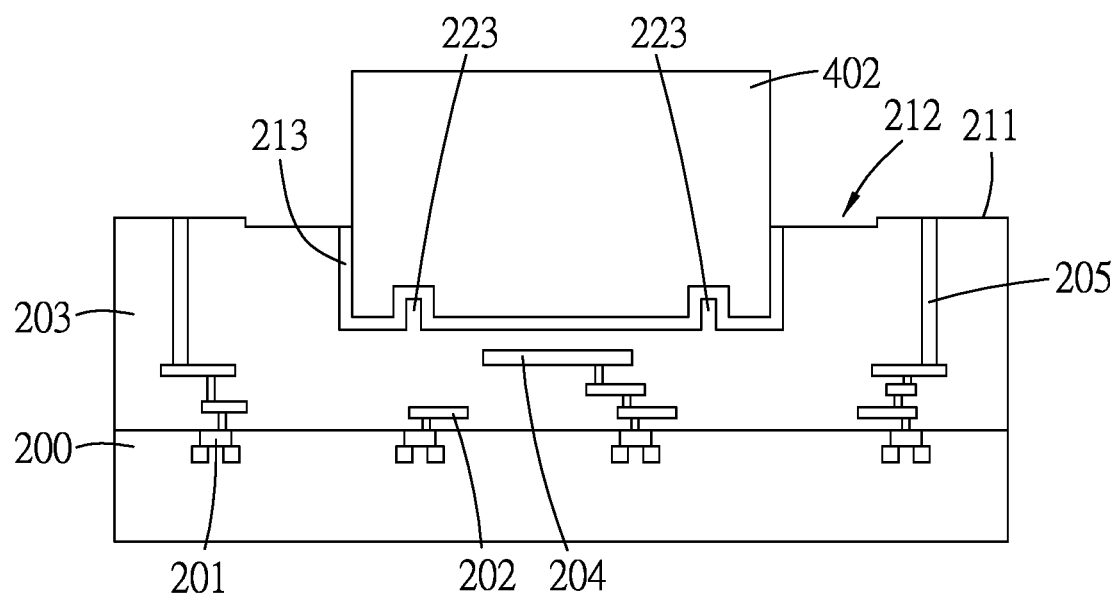

The structure shown in FIG. 25 is a variation of that in FIG. 21. Similar to FIG. 21, as illustrated in FIG. 25, the surface modification layer 213 outside of the removable feature 402 may be removed by a suitable technique, such as dry etch, wet etch, a combination thereof, or the like, thereby exposing the bonding wall 211 and the recess 212 from the surface modification layer 213. In some embodiments, the removable feature 402 covering the surface modification layer 213 may serve to protect the surface modification layer 213 (i.e., the surface modification layer 213 covering the bottom wall portion 208 and the sidewall portion 209 of the cavity-defining wall 210 (see FIG. 12) and covering the protruding bumps 223). Afterward, process 414 in the flow chart 400 shown in FIG. 17 may be carried out to remove the removable feature 402 so as to expose the surface modification layer 213 previously covered by the removable feature 402, thereby obtaining a structure illustrated in FIG. 26. Then, process 416 in the flow chart 400 shown in FIG. 17 may be carried out to obtain the MEMS device 300 shown in FIG. 27.

Figure 26:
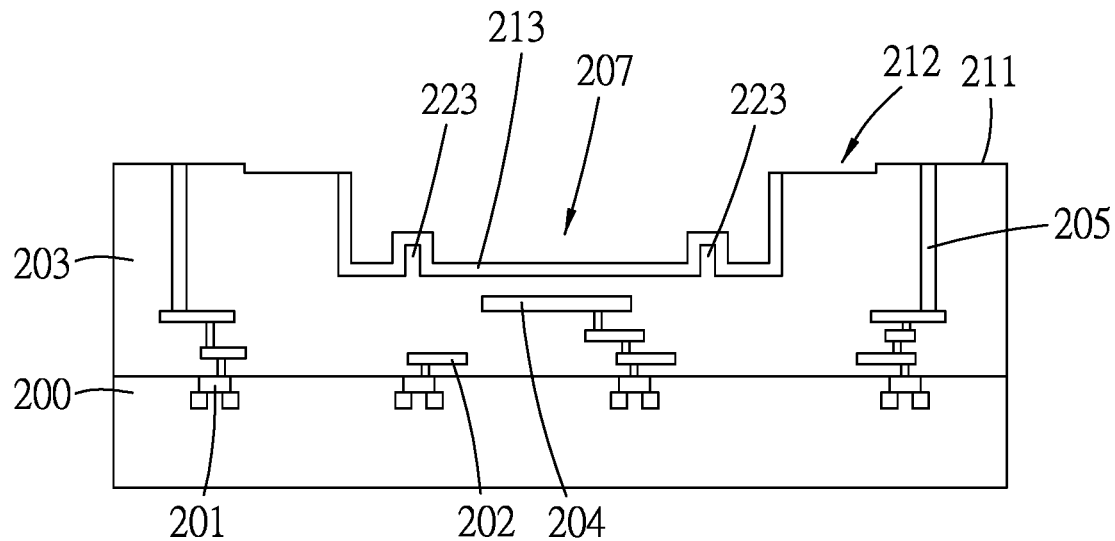
Figure 27:
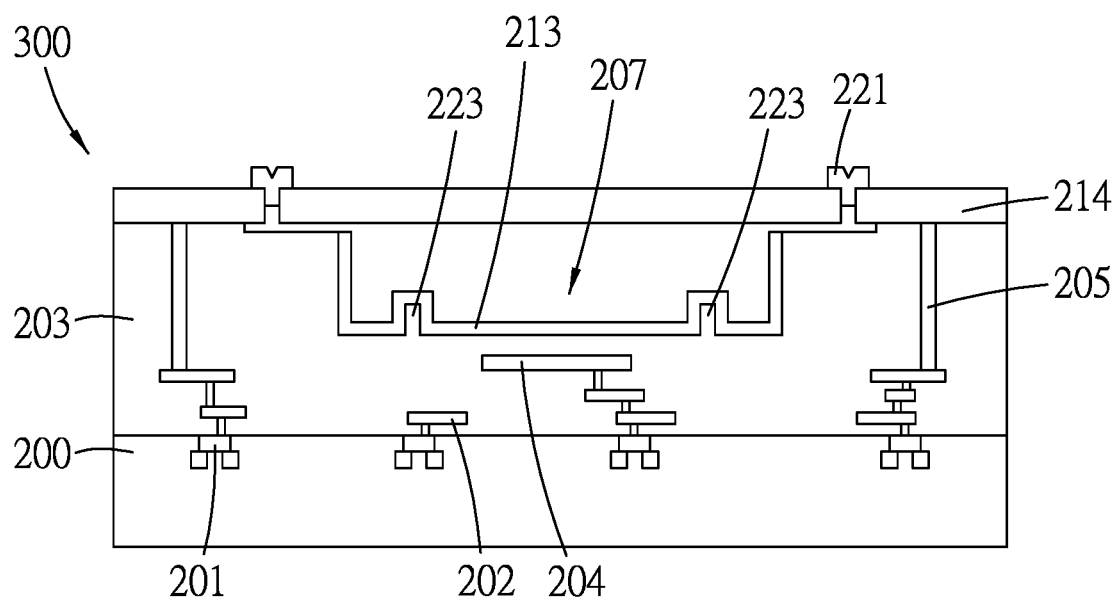
Figure 28:
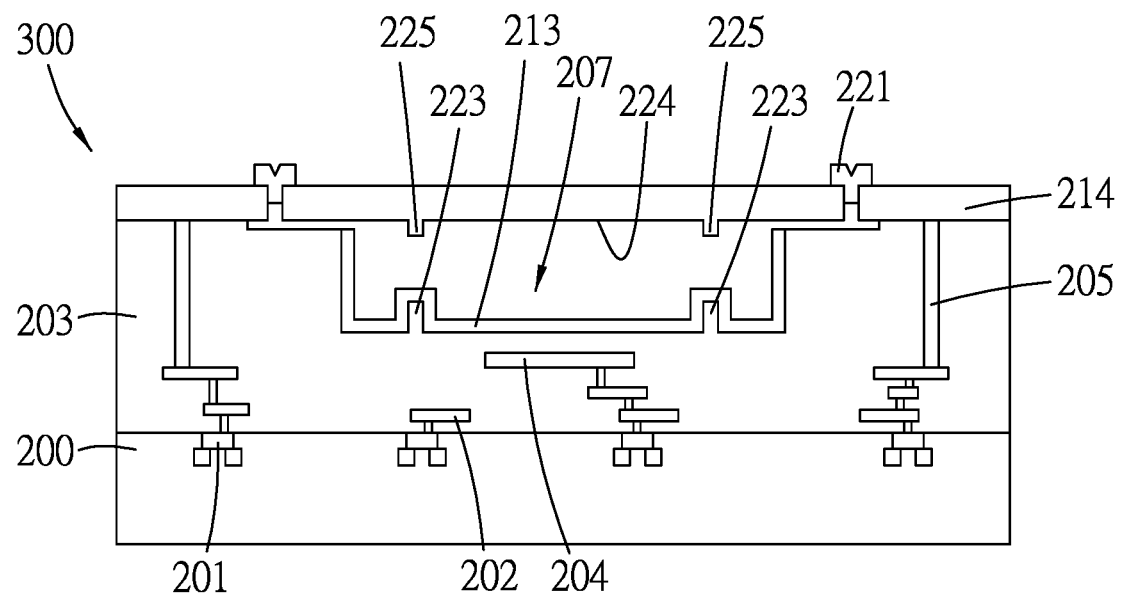
FIG. 28 is a schematic sectional view showing a MEMS device in accordance with some embodiments.

Referring to FIG. 28, in some embodiments, a surface of the semiconductor wafer (not shown) (i.e., the surface 224 of the subsequently formed membrane 214) facing the cavity 207 may also be formed with a plurality of protruding bumps 225 before being connected to the bonding wall 211 of the dielectric layer 203 (see FIG. 26). The protruding bumps 225 may be formed by etching the semiconductor wafer, by epitaxially growing from the semiconductor wafer, by depositing a suitable material on the semiconductor wafer, or by other suitable techniques. In some embodiments, the protruding bumps 225 may correspond in position to the protruding bumps 223. It should be noted that the number, shape, position and arrangement of the protruding bumps 225 may be changed according to practical requirements.

Figure 29:
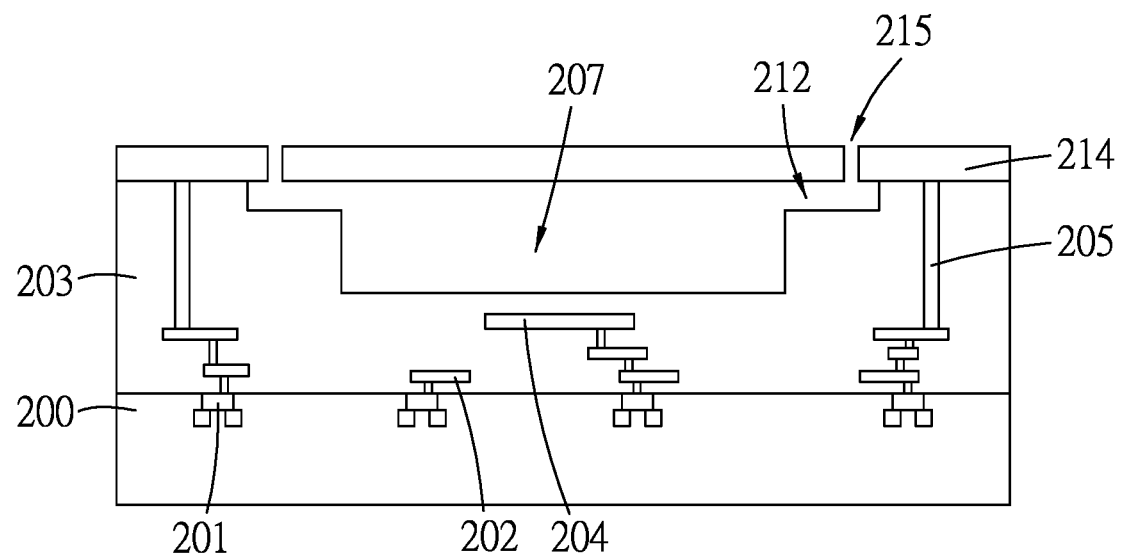
FIGS. 29 to 31 show intermediate steps for making a MEMS device in accordance with some embodiments.

Referring to FIG. 29, in some embodiments, after the formation of the cavity 207 (i.e., after process 104 in the flow chart 100 shown in FIG. 1), the membrane 214 is formed and is connected to the bonding wall 211 (see FIG. 3), and the opening 215 is formed in the membrane 214. In some embodiments, at least one of the protruding bumps 223, 225 (see FIG. 28) may be formed, according to practical requirements.

Figure 30:
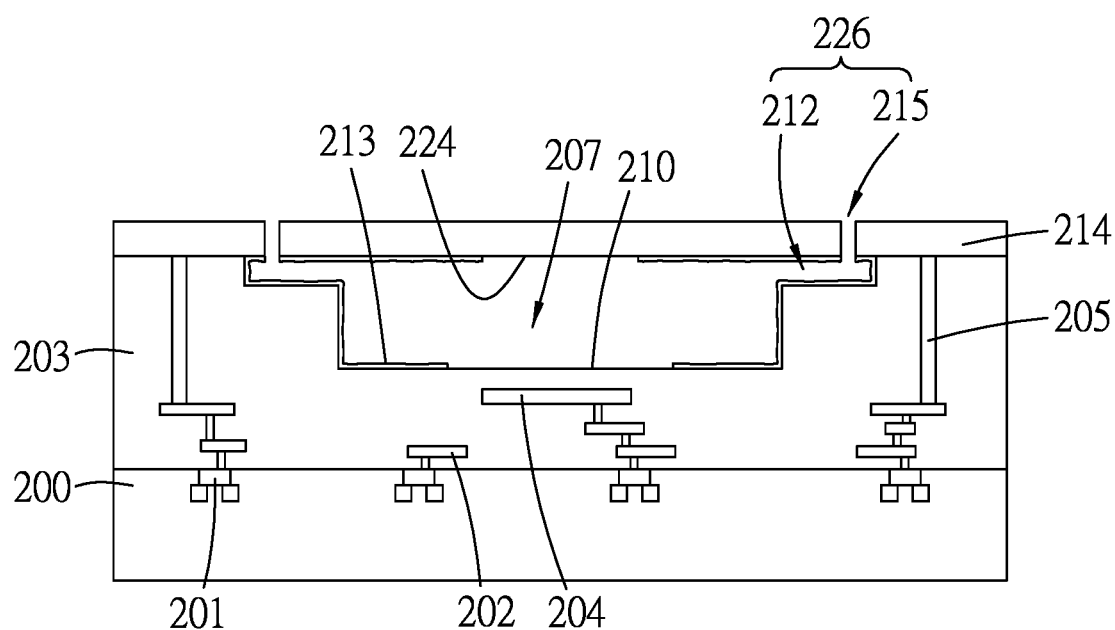

Referring to FIG. 30, in some embodiments, after the process shown in FIG. 29, the surface modification layer 213 may be formed by injecting the self-assembled precursor into the cavity 207 through the venting passage 226 that includes the opening 215 and the recess 212. In some embodiments, the self-assembled precursor may immediately react with the dielectric layer 203 to form the surface modification layer 213; and in other embodiments, the self-assembled precursor may be first injected into the cavity 207 without being reacted with the dielectric layer 203, followed by a delayed reaction with the dielectric layer 203. Such delayed reaction may be achieved by various techniques, such as adjusting the temperature, adjusting the concentration of the self-assembled precursor, a combination thereof, or other suitable techniques. In some embodiments, the surface modification layer 213 may be a non-uniform layer with varying thickness at different locations (i.e., the surface modification layer 213 is not conformally formed). In some embodiments, a portion of the cavity-defining wall 210 may not be covered with the surface modification layer 213. In some embodiments, at least a portion of the surface 224 of the subsequently formed membrane 214 may be covered with the surface modification layer 213.

Figure 31:
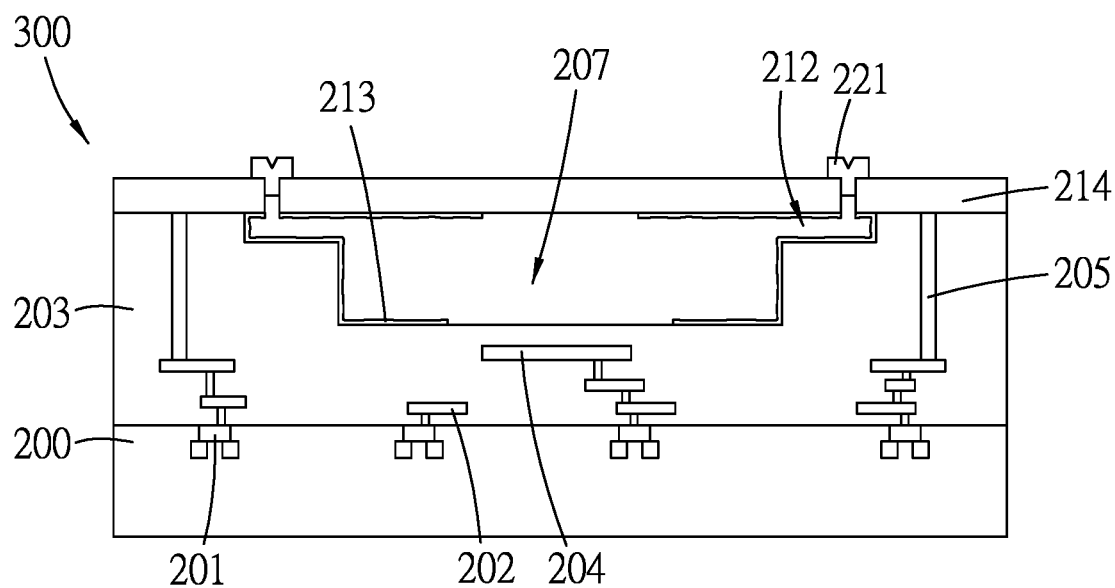

Referring to FIG. 31, after the process illustrated in FIG. 30, the cavity 207 may be vented through the venting passage 226 (see FIG. 30), followed by sealing the venting passage 226 with the seal 221, thereby obtaining the MEMS device 300.

The embodiments of the present disclosure have some advantageous features. By having the surface modification layer covering the cavity-defining wall, adhesion of the membrane to the bottom wall portion of the cavity-defining wall may be alleviated, thereby preventing malfunction or damage of the MEMS device caused by such adhesion. In addition, according to the exemplary method of the present disclosure, a substantial uniform (conformal) surface modification layer may be formed on the cavity-defining wall, thereby conferring the MEMS device with superior anti-adhesion property.

In accordance with some embodiments, a microelectromechanical system device (MEMS) includes a substrate, a dielectric layer, an electrode, a surface modification layer and a membrane. The dielectric layer is formed on the substrate, and is formed with a cavity that is defined by a cavity-defining wall. The electrode is formed in the dielectric layer. The surface modification layer covers the cavity-defining wall, and has a plurality of hydrophobic end groups. The membrane is connected to the dielectric layer and seals the cavity. The membrane is movable toward or away from the electrode.

In accordance with some embodiments, the surface modification layer is a self-assembled monolayer that has a plurality of head groups connected to the cavity-defining wall and the hydrophobic end groups respectively connected to the head groups, the head groups including silane or alkyl.

In accordance with some embodiments, the surface modification layer includes a high-dielectric material.

In accordance with some embodiments, the surface modification layer has a thickness ranging from about 10 Å to about 100 Å.

In accordance with some embodiments, at least one of the substrate and the membrane is formed with a protruding bump facing the cavity.

In accordance with some embodiments, the MEMS device further includes: a venting passage penetrating the membrane and the dielectric layer and in spatial communication with the cavity; and a seal sealing the venting passage so as to hermetically isolate the cavity from the outside environment.

In accordance with some embodiments, a method for making a microelectromechanical system device includes: forming a dielectric layer on a substrate, the dielectric layer having an electrode formed therein; forming a cavity in the dielectric layer so that the electrode is disposed underneath the cavity, the cavity being defined by a cavity-defining wall of the dielectric layer; forming a removable feature on the dielectric layer outside of the cavity-defining wall; forming a surface modification layer covering the removable feature and the cavity-defining wall, the surface modification layer having a plurality of hydrophobic end groups; removing the removable feature and the surface modification layer on the removable feature; and sealing the cavity with a membrane, the membrane being connected to the dielectric layer and being movable toward or away from the electrode.

In accordance with some embodiments, the step of forming the removable feature includes forming a photoresist layer on the dielectric layer and covering the cavity-defining wall, followed by developing the photoresist layer to remove the photoresist layer on the cavity-defining wall.

In accordance with some embodiments, the step of forming the surface modification layer includes exposing the dielectric layer and the removable feature to a self-assembled precursor, the self-assembled precursor including a plurality of head groups that are bonded to the dielectric layer and the removable feature, and the hydrophobic end groups that are respectively connected to the head groups.

In accordance with some embodiments, the head groups include silane or alkyl.

In accordance with some embodiments, the surface modification layer includes a high-dielectric material.

In accordance with some embodiments, the step of sealing the cavity includes connecting a semiconductor wafer to the dielectric layer though fusion bonding, followed by thinning the semiconductor wafer into the membrane.

In accordance with some embodiments, the step of forming the cavity includes forming a recess in the dielectric layer, the recess being in spatial communication with the cavity. The step of sealing the cavity with the membrane includes: forming an opening in the membrane, the opening being in spatial communication with the recess and cooperating with the recess to define a venting passage; venting the cavity through the venting passage; and sealing the opening so as to hermetically isolate the cavity from the outside environment.

In accordance with some embodiments, in the step of forming the removable feature, the removable feature covers the recess. In the step of removing the removable feature and the surface modification layer on the removable feature, the removable feature on the recess is removed so as to expose the recess, and the surface modification layer being outside of the recess.

In accordance with some embodiments, a method for making a microelectromechanical system device includes: forming a dielectric layer on a substrate, the dielectric layer having an electrode formed therein; forming a cavity in the dielectric layer so that the electrode is disposed underneath the cavity, the dielectric layer having a cavity-defining wall that defines the cavity and a bonding wall that is outside of the cavity-defining wall; forming a surface modification layer covering the bonding wall and the cavity-defining wall, the surface modification layer having a plurality of hydrophobic end groups; removing the surface modification layer on the bonding wall; and sealing the cavity with a membrane, the membrane being connected to the bonding wall and being movable toward or away from the electrode.

In accordance with some embodiments, the step of removing the surface modification layer includes: covering the surface modification layer on the cavity-defining wall with a removable feature; removing the surface modification layer on the bonding wall; and removing the removable feature.

In accordance with some embodiments, the step of covering the surface modification layer on the cavity-defining wall with the removable feature includes covering the surface modification layer on the bonding wall and the cavity-defining wall with a photoresist layer, followed by developing the photoresist layer to remove the photoresist layer on the bonding wall.

In accordance with some embodiments, the step of forming the surface modification layer includes exposing the substrate to a self-assembled precursor, the self-assembled precursor including a plurality of head groups that are bonded to the substrate and the removable feature, and the hydrophobic end groups that are respectively connected to the head groups.

In accordance with some embodiments, the step of forming the cavity includes forming a recess in the dielectric layer, the recess being in spatial communication with the cavity. The step of sealing the cavity with the membrane includes: forming an opening in the membrane, the opening being in spatial communication with the recess and cooperating with the recess to define a venting passage; venting the cavity through the venting passage; and sealing the opening so as to hermetically isolate the cavity from the outside environment.

In accordance with some embodiments, in the step of forming the surface modification layer, the recess is covered by the surface modification layer. In the step of removing the surface modification layer, the surface modification layer covering the recess is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectromechanical system (MEMS) device comprising:
   a substrate;
   a dielectric layer being formed on the substrate, and being formed with a cavity that is defined by a cavity-defining wall;
   an electrode formed in the dielectric layer;
   a surface modification layer covering the cavity-defining wall, the surface modification layer having a plurality of hydrophobic end groups;
   a membrane connected to the dielectric layer and sealing the cavity, the membrane being movable toward or away from the electrode;
   a venting passage penetrating the membrane and the dielectric layer and being in spatial communication with the cavity; and
   a seal sealing the venting passage so as to hermetically isolate the cavity from the outside environment.

2. The MEMS device as claimed in claim 1, wherein the surface modification layer is a self-assembled monolayer that has a plurality of head groups connected to the cavity-defining wall and the hydrophobic end groups respectively connected to the head groups, the head groups including silane or alkyl.

3. The MEMS device as claimed in claim 1, wherein the surface modification layer includes a high-dielectric material.

4. The MEMS device as claimed in claim 1, wherein the surface modification layer has a thickness ranging from about 10 Å to about 100 Å.

5. The MEMS device as claimed in claim 1, wherein at least one of the dielectric layer and the membrane is formed with a protruding bump in the cavity.

6. A method for making a microelectromechanical system (MEMS) device, the method comprising:
forming a dielectric layer on a substrate, the dielectric layer having an electrode formed therein;
forming a cavity in the dielectric layer so that the electrode is disposed underneath the cavity, the cavity being defined by a cavity-defining wall of the dielectric layer;
forming a surface modification layer covering the cavity-defining wall, the surface modification layer having a plurality of hydrophobic end groups; and
sealing the cavity with a membrane, the membrane being connected to the dielectric layer and being movable toward or away from the electrode,
wherein sealing the cavity includes connecting a semiconductor wafer to the dielectric layer though fusion bonding, followed by thinning the semiconductor wafer into the membrane.

7. The method as claimed in claim 6, further comprising:
prior to forming the surface modification layer, forming a removable feature on the dielectric layer outside of the cavity-defining wall such that the surface modification layer is formed to cover the removable feature and the cavity-defining wall; and
after forming the surface modification layer, removing the removable feature and the surface modification layer on the removable feature.

8. The method as claimed in claim 7, wherein forming the surface modification layer includes exposing the dielectric layer and the removable feature to a self-assembled precursor, the self-assembled precursor including a plurality of head groups that are bonded to the dielectric layer and the removable feature, and the hydrophobic end groups that are respectively connected to the head groups.

9. The method as claimed in claim 8, wherein the head groups include silane or alkyl.

10. The method as claimed in claim 6, wherein the surface modification layer includes a high-dielectric material.

11. The method as claimed in claim 6, wherein:
forming the cavity includes forming a recess in the dielectric layer, the recess being in spatial communication with the cavity; and
sealing the cavity with the membrane includes
forming an opening in the membrane, the opening being in spatial communication with the recess and cooperating with the recess to define a venting passage,
venting the cavity through the venting passage, and
sealing the opening so as to hermetically isolate the cavity from the outside environment.

12. The method as claimed in claim 11, wherein:
during forming the removable feature, the removable feature covers the recess; and
during removing the removable feature and the surface modification layer on the removable feature, the removable feature on the recess is removed so as to expose the recess, and the surface modification layer being outside of the recess.

13. A method for making a microelectromechanical system (MEMS) device, the method comprising:
forming a dielectric layer on a substrate, the dielectric layer having an electrode formed therein;
forming a cavity in the dielectric layer so that the electrode is disposed underneath the cavity, the dielectric layer having a cavity-defining wall that defines the cavity and a bonding wall that is outside of the cavity-defining wall;
forming a surface modification layer covering the bonding wall and the cavity-defining wall, the surface modification layer having a plurality of hydrophobic end groups;
removing the surface modification layer on the bonding wall; and
sealing the cavity with a membrane, the membrane being connected to the bonding wall and being movable toward or away from the electrode.

14. The method as claimed in claim 13, wherein removing the surface modification layer includes:
covering the surface modification layer on the cavity-defining wall with a removable feature;
removing the surface modification layer on the bonding wall; and
removing the removable feature.

15. The method as claimed in claim 14, wherein covering the surface modification layer on the cavity-defining wall with the removable feature includes covering the surface modification layer on the bonding wall and the cavity-defining wall with a photoresist layer, followed by developing the photoresist layer to remove the photoresist layer on the bonding wall.

16. The method as claimed in claim 13, wherein forming the surface modification layer includes exposing the dielectric layer to a self-assembled precursor, the self-assembled precursor including a plurality of head groups that are bonded to the dielectric layer and the removable feature, and the hydrophobic end groups that are respectively connected to the head groups.

17. The method as claimed in claim 13, wherein:
forming the cavity includes forming a recess in the dielectric layer, the recess being in spatial communication with the cavity; and
sealing the cavity with the membrane includes
forming an opening in the membrane, the opening being in spatial communication with the recess and cooperating with the recess to define a venting passage,
venting the cavity through the venting passage, and
sealing the opening so as to hermetically isolate the cavity from the outside environment.

18. The method as claimed in claim 17, wherein:
during forming the surface modification layer, the recess is covered by the surface modification layer; and
during removing the surface modification layer, the surface modification layer covering the recess is removed.

19. The method as claimed in claim 13, wherein the surface modification layer is prepared from one of octadecyltrichlorosilane (OTS), dodecyltrichlorosilane (DTS), perfluorodecyltrichlorosilane (FDTS), hexadecyltrichlorosilane (HTS), dimethyldichlorosilane (DDMS), and fluoro-octyl-trichloro-silane (FOTS).

20. The method as claimed in claim 14, wherein the surface modification layer is formed by exposing the removable feature and the cavity-defining wall to a self-assembled precursor which is one of a silane-based material, an alkyl-based material, and a combination thereof.

* * * * *